(12) United States Patent
Chen et al.

(10) Patent No.: US 8,168,538 B2
(45) Date of Patent: May 1, 2012

(54) BURIED SILICIDE STRUCTURE AND METHOD FOR MAKING

(75) Inventors: Shih-Hung Chen, Hsinchu (TW); Tian-Jue Hong, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 208 days.

(21) Appl. No.: 12/472,158

(22) Filed: May 26, 2009

(65) Prior Publication Data

US 2010/0301304 A1  Dec. 2, 2010

(51) Int. Cl.
  *H01L 21/44* (2006.01)
  *H01L 21/4763* (2006.01)
  *H01L 21/302* (2006.01)
  *H01L 21/461* (2006.01)

(52) U.S. Cl. ........ 438/682; 438/630; 438/664; 438/721; 257/5; 257/68; 257/71; 257/754; 257/E23.157; 257/E29.156; 257/E27.084; 257/E27.087; 257/E27.088

(58) Field of Classification Search ....... 257/5, E45.002, 257/E21.576, 68, 71, 754, E27.084, E27.087–E27.088; 438/630, 664, 682, 721; 365/148
See application file for complete search history.

(56) References Cited

U.S. PATENT DOCUMENTS

| | | | |
|---|---|---|---|
| 5,687,112 A | 11/1997 | Ovshinsky | |
| 5,841,150 A | 11/1998 | Gonzalez et al. | |
| 6,011,272 A | 1/2000 | Omid-Zohoor et al. | |
| 6,077,745 A * | 6/2000 | Burns et al. | 438/270 |
| 6,525,953 B1 | 2/2003 | Johnson | |
| 6,649,976 B2 | 11/2003 | Iwamatsu et al. | |
| 6,653,733 B1 | 11/2003 | Gonzalez et al. | |
| 6,737,675 B2 | 5/2004 | Patel et al. | |
| 6,800,504 B2 | 10/2004 | Li et al. | |
| 6,815,298 B2 | 11/2004 | Tsuchiaki | |
| 6,891,235 B1 | 5/2005 | Furukawa et al. | |
| 7,081,377 B2 | 7/2006 | Cleeves | |
| 7,129,538 B2 | 10/2006 | Lee et al. | |
| 7,351,648 B2 | 4/2008 | Furukawa et al. | |
| 7,365,385 B2 * | 4/2008 | Abbott | 257/302 |
| 7,427,531 B2 | 9/2008 | Cho et al. | |
| 7,551,473 B2 | 6/2009 | Lung et al. | |
| 7,651,906 B2 | 1/2010 | Park et al. | |
| 2001/0017384 A1 | 8/2001 | Economikos et al. | |

(Continued)

OTHER PUBLICATIONS

Gilbert, Nad E., "A macro model of programmable metallization cell devices," Solid-State Electronics 49 (2005) 1813-1819.

(Continued)

*Primary Examiner* — Zandra Smith
*Assistant Examiner* — Jeremy Joy
(74) *Attorney, Agent, or Firm* — Haynes Beffel & Wolfeld LLP

(57) ABSTRACT

Methods for manufacturing buried silicide lines are described herein, along with high density stacked memory structures. A method for manufacturing an integrated circuit as described herein includes forming a semiconductor body comprising silicon. A plurality of trenches are formed in the semiconductor body to define semiconductor lines comprising silicon between adjacent trenches, the semiconductor lines having sidewalls. A silicide precursor is deposited within the trenches to contact the sidewalls of the semiconductor lines, and a portion of the silicide precursor is removed to expose upper portions of the sidewalls and leave remaining strips of silicide precursor along the sidewalls. Silicide conductors are then formed by inducing reaction of the strips of silicide with the silicon of the semiconductor lines.

13 Claims, 34 Drawing Sheets

U.S. PATENT DOCUMENTS

| | | | |
|---|---|---|---|
| 2001/0055838 | A1 | 12/2001 | Walker et al. |
| 2005/0029502 | A1 | 2/2005 | Hudgens |
| 2005/0029587 | A1 | 2/2005 | Harshfield |
| 2005/0270832 | A1 | 12/2005 | Chu et al. |
| 2006/0017088 | A1* | 1/2006 | Abbott et al. ............... 257/302 |
| 2006/0172067 | A1 | 8/2006 | Ovshinsky et al. |
| 2006/0186483 | A1 | 8/2006 | Cho et al. |
| 2006/0284237 | A1* | 12/2006 | Park et al. ............... 257/314 |
| 2007/0295995 | A1* | 12/2007 | Yun et al. ............... 257/202 |
| 2008/0280401 | A1 | 11/2008 | Burr et al. |
| 2009/0045448 | A1* | 2/2009 | Baik et al. ............... 257/314 |
| 2009/0072215 | A1 | 3/2009 | Lung et al. |
| 2009/0166600 | A1 | 7/2009 | Park et al. |
| 2010/0171188 | A1* | 7/2010 | Lung et al. ............... 257/413 |

OTHER PUBLICATIONS

Johnson, Mark, et al., "512-Mb PROM With a Three-Dimensional Array of Diode/Antifuse Memory Cells," IEEE Journal of Solid-State Circuits 38(11), Nov. 2003, 9 pages.

Lung, Hsiang-Lan, et al. U.S. Appl. No. 12/349,874 entitled "Integrated Circuit Memory with Single Crystal Silicon on Silicide Driver and Manufacturing Method," filed Jan. 7, 2009, 39 pages.

Lung, Hsiang-Lan, et al., U.S. Appl. No. 12/349,903, entitiled "Integrated Circuit Device with Single Crystal Silicon on Silicide and Manufacturing Method," filed Jan. 7, 2009, 26 pages.

Yamada, Noboru, "Potential of Ge—Sb—Te phase-change optical disks for high-data-rate recording in the near future," (Conference Proceedings Paper), Jul. 30, 1997, vol. 3109, 10 pages.

* cited by examiner

800

BURIED SILICIDE STRUCTURE AND METHOD FOR MAKING

BACKGROUND OF THE INVENTION

1. Field of the Invention

The present invention relates to high density integrated circuit devices including buried silicide conductors, and to methods for manufacturing such devices.

2. Description of Related Art

One common technology for interconnecting components on integrated circuits is the use of buried diffusion lines, which consist of lines of implanted dopants in relatively high concentration, so that they act as electrical conductors in the substrate.

A problem that arises with the use of buried diffusion lines is the loading effect due to their relatively high resistance. In operation, the relatively large resistance of the implanted dopants compared to that of metal results in increased power consumption and a reduction in the operation speed of the device. As a result, various techniques have been used to reduce the loading effect of the buried diffusion lines.

One approach is to reduce the resistance of the lines by increasing the dopant concentration. However, increasing the dopant concentration also increases the diffusion of the dopants into the substrate, making the implantation process more difficult to control. This can result in a loss of the desired pattern for the line, and limits the spacing between the lines.

Another approach to reducing the loading effect is to implement lower resistivity metal lines in parallel with the buried diffusion lines. Typically, the metal lines are formed on a dielectric layer overlying the buried diffusion lines. A series of metal contacts at intervals along a buried diffusion line extend through the dielectric layer to establish contact with a corresponding metal line. While parallel metal lines assist in reducing the loading effect of the buried diffusion lines, the metal lines and contacts can limit the density of the device and increases complexity of designs and manufacturing processes.

Silicides are also commonly used in integrated circuit manufacturing to increase the conductivity of doped lines or elements. A common version of the material is referred to as a "salicide", changing the first two letters of the word to "sa-", in a reference to self-aligned techniques for forming the material on the chip. A self-aligned process for forming silicide involves depositing a silicide precursor over a substrate that includes exposed regions of silicon, and annealing the silicide precursor to form a silicide in the exposed regions. Then the remaining silicide precursor on the substrate is removed, leaving the self-aligned silicide elements. Typical silicide precursors include metals or combinations of metals such as cobalt, titanium, nickel, molybdenum, tungsten, tantalum, and platinum. Also, silicide precursors may include metal nitrides or other metal compounds. Representative uses of silicide in integrated circuit manufacturing are shown in U.S. Pat. Nos. 7,365,385; 7,129,538; 7,081,377; 6,891,235; 6,815,298; 6,737,675; 6,653,733; 6,649,976; and 6,011,272; in U.S. Patent Publication Nos. 2001/0055838; and 2006/0017088. See also U.S. patent application Ser. Nos. 12/349903, and 12/349874, both applications commonly owned by the assignee of the present application.

In the manufacturing of high density memory the amount of data per unit area on an integrated circuit can be a critical factor. Thus, technologies for stacking multiple arrays of anti-fuse memory have been proposed. See, for example, U.S. Pat. No. 7,081,377 to Cleeves entitled "Three-Dimensional Memory". See, also, Johnson et al., "512-Mb PROM with a Three-Dimensional Array of Diode/Anti-fuse Memory Cells", IEEE J. of Solid-State Circuits, vol. 38, no. 11, November 2003.

In the designs described in Cleeves and Johnson et al., a p+ polysilicon anode and an n− polysilicon cathode are separated by anti-fuse material to provide a one-time programmable (OTP) memory. The OTP memory is programmed by applying a voltage across the anti-fuse material sufficient to induce a breakdown in the anti-fuse material to cause a permanent change in the resistance of the material.

Electrically erasable and reprogrammable nonvolatile memory offers more flexibility than OTP memory since the information stored can be written and erased numerous times.

Accordingly, a need arises to provide methods for manufacturing devices to address the loading effect issues of doped semiconductor lines. In addition, an opportunity arises to provide high density stacked electrically erasable and reprogrammable memory structures that can be readily manufactured using these methods.

SUMMARY OF THE INVENTION

A method for manufacturing an integrated circuit device as described herein includes forming a semiconductor body comprising silicon, and forming a plurality of trenches in the semiconductor body to define semiconductor lines having sidewalls and comprising silicon between adjacent trenches. A silicide precursor is then deposited within the trenches to contact the sidewalls of the semiconductor lines, and a portion of the silicide precursor is then removed to expose upper portions of the sidewalls and leave remaining strips of silicide precursor along the sidewalls. Formation of silicide conductors is then induced by reaction of the strips of silicide precursor with the silicon of the semiconductor lines.

The silicide conductors have a higher electrical conductivity than that of the silicon material of the semiconductor lines. The higher electrical conductivity of the silicide lines thus reduces the loading effect of the silicon material of the semiconductor lines.

In some embodiments the formation of the silicide conductors consumes silicon of the semiconductor lines until the silicide conductors extend between adjacent trenches in the plurality of trenches. Alternatively, the formation of the silicide conductors forms a first silicide conductor along a first sidewall of a corresponding semiconductor line, and a second silicide conductor along a second sidewall of the corresponding semiconductor line. The first and second silicide conductors are separated by remaining silicon of the corresponding silicide conductors.

The silicide conductors are formed below the top surface of the silicon of the semiconductor lines using techniques which do not form silicide on the top surface of the silicon. As a result, the top surface of the silicon material can be utilized in subsequent process steps to form high density stacked structures. For example, the silicon material can be utilized as vertical access devices such as diodes and transistors in memory arrays, and in other vertical device structures.

A memory device as described herein can be readily manufactured using the processes described herein and includes a first array of memory cells underlying a second array of memory cells, the first and second arrays of memory cells separated from one another by an insulator layer. The first array of memory cells comprises a plurality of word lines comprising doped silicon material, with silicide conductors below top surfaces of the doped silicon material. A plurality of bit lines overly the word lines, and a plurality of memory cells are located between the bit lines and the word lines.

Memory cells in the plurality of memory cells comprise a diode and a programmable resistance memory element programmable to a plurality of resistance states, the diode and the memory element arranged in electrical series between a corresponding word line and a corresponding bit line.

The second array of memory cells overlies the first array of memory cells and also comprises a plurality of word lines comprising doped silicon material, with silicide conductors below top surfaces of the doped silicon material. A plurality of bit lines overly the word lines, and a plurality of memory cells are located between the bit lines and the word lines. Memory cells in the plurality of memory cells comprise a diode and a programmable resistance memory element programmable to a plurality of resistance states, the diode and the memory element arranged in electrical series between a corresponding word line and a corresponding bit line.

The memory device further includes bias circuitry to apply bias arrangements to a selected memory cell. The bias arrangements include a first bias arrangement to change the resistance state of the selected memory cell from a first resistance state to a second resistance state, and a second bias arrangement to change the resistance from the second resistance state to the first resistance state.

Other aspects and advantages of the present invention can be seen on review of the drawings, the detailed description, and the claims which follow.

BRIEF DESCRIPTION OF THE DRAWINGS

FIGS. 1 to 5A-5B illustrate an embodiment of steps in a fabrication sequence for manufacturing buried silicide lines to reduce the loading effect of doped silicon material.

FIGS. 8 to 16A-16B illustrate an embodiment of steps in a fabrication sequence for manufacturing a stacked memory array having buried silicide lines.

FIGS. 26 to 28A-28B illustrate an embodiment of steps in a fabrication sequence for manufacturing a stacked memory array having buried silicide lines.

DETAILED DESCRIPTION

FIGS. 1-5 illustrate an embodiment of steps in a fabrication sequence for manufacturing buried silicide lines to reduce the loading effect of doped silicon material.

Figure 1:
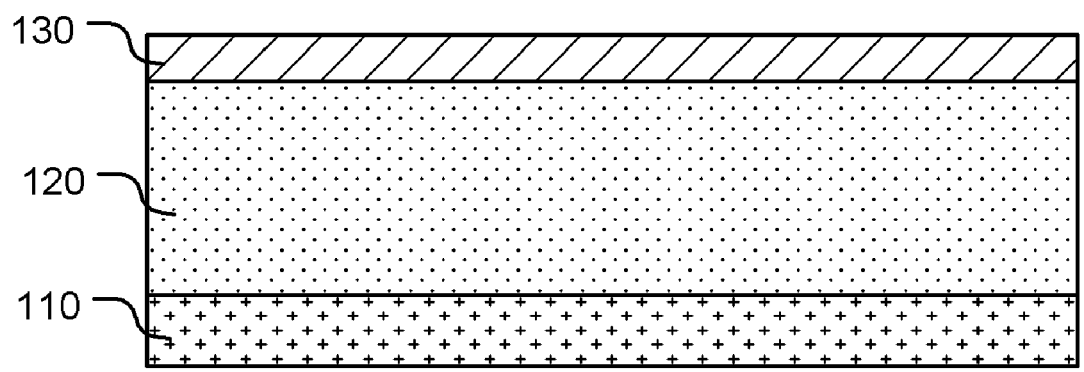

FIG. 1 illustrates a cross-sectional view of a step of forming a semiconductor body 100 by forming a layer of doped silicon 120 on an insulator layer 110, and forming a protection layer 130 on the layer of silicon 120. The layer of silicon 120 may be formed on the insulator layer 110, for example, using silicon-on-insulator techniques or the like. In the illustrated embodiment the insulator layer 110 comprises silicon dioxide.

The protection layer 130 can serve as an etch stop layer for the subsequent process steps described below. In the illustrated embodiment the protection layer 130 comprises silicon nitride. Alternatively, other materials may be used.

Figure 2A:
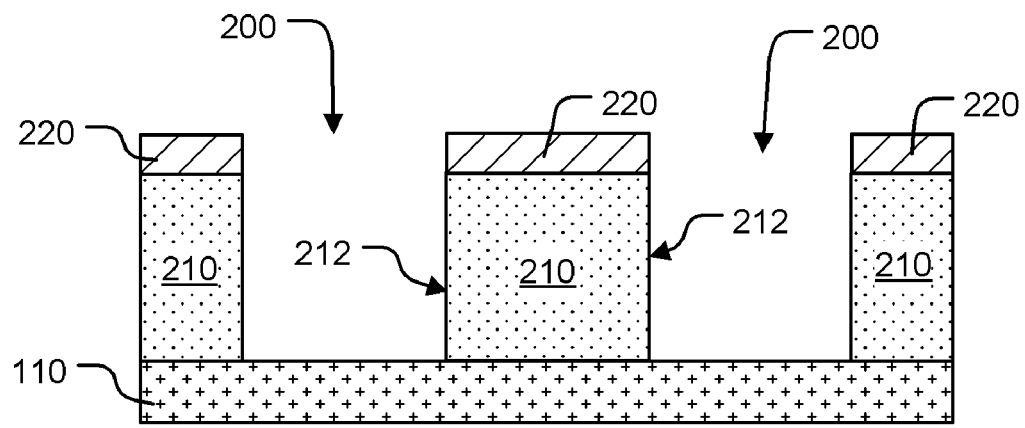
Figure 2B:
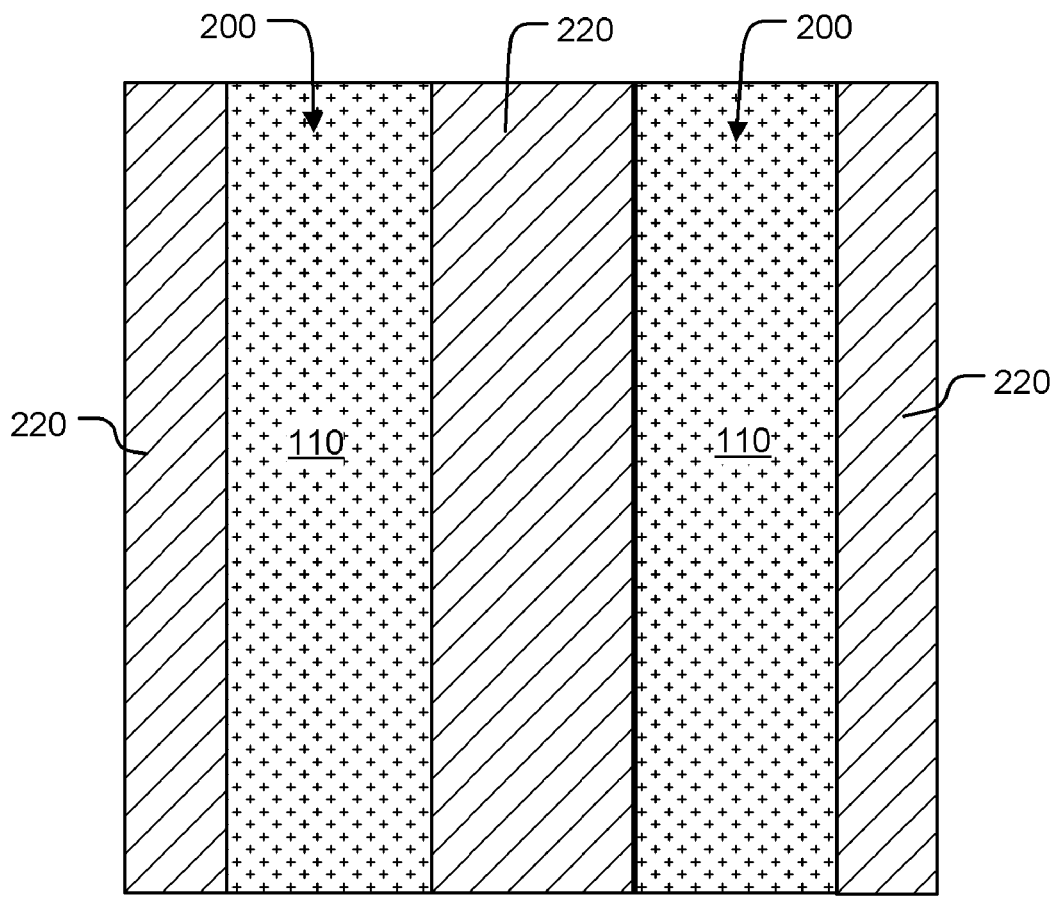

Next, a plurality of trenches 200 are formed through the protection layer 130 and the layer of silicon 120 to expose portions of the insulator layer 110, resulting in the structure illustrated in the cross-sectional and top views of FIGS. 2A and 2B respectively. The trenches 200 can be formed by forming a mask (for example a patterned photoresist) on the protection layer 130, and then etching through the layers 130, 120 using the mask as an etch mask.

The trenches 200 define semiconductor lines 210 comprising silicon material of the layer and having sidewalls 212, and lines 220 comprising material of the protection layer 130 on the semiconductor lines 210.

Figure 3A:
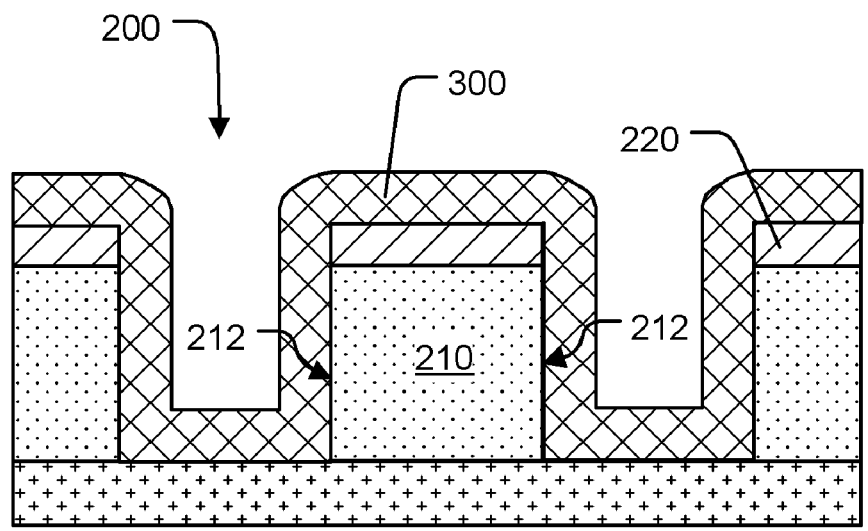
Figure 3B:
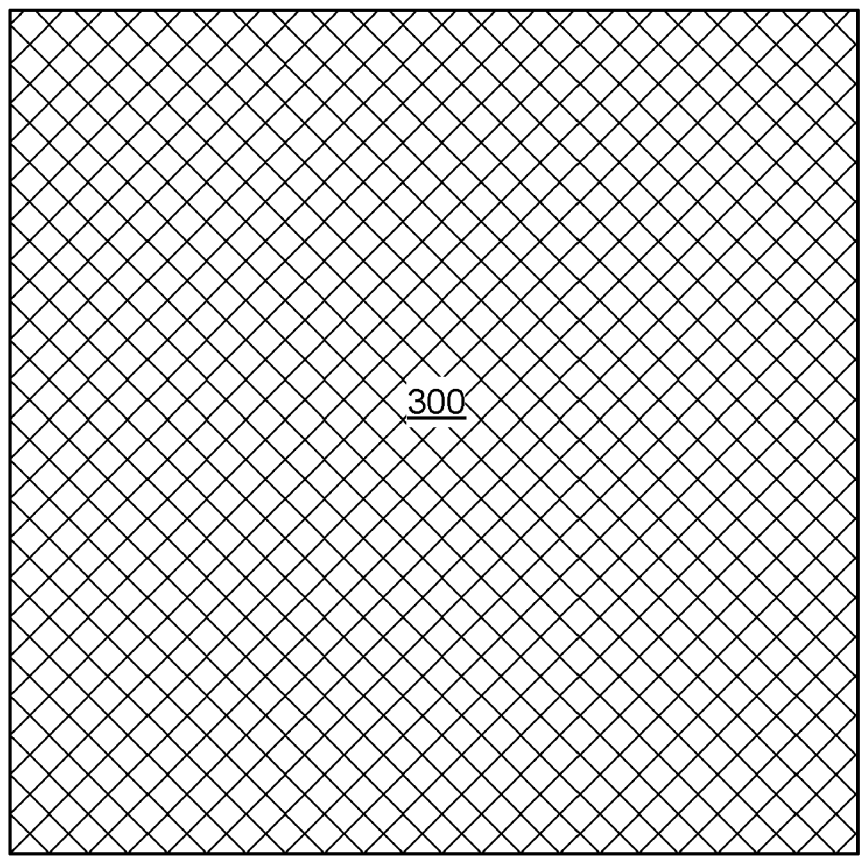

Next, a layer 300 of silicide precursor is formed on the structure of FIGS. 2A-2B resulting in the structure illustrated in the top and cross-sectional views of FIGS. 3A and 3B respectively. As can be seen in FIG. 3A the layer 300 of silicide precursor is conformal with the trenches 200 and thus contacts the sidewalls 212 of the semiconductor lines 210.

The layer 300 of silicide precursor can be formed, for example, using a sputtering process, chemical vapor deposition (CVD), or atomic layer deposition (ALD). In some embodiments, CVD or ALD may be preferred for use in forming the layer 300.

In the illustrated embodiment the layer 300 comprises cobalt. Alternatively, other silicide precursors may be used. Examples of silicide precursors include titanium, tungsten, nickel, molybdenum, platinum, and tantalum.

Figure 4A:
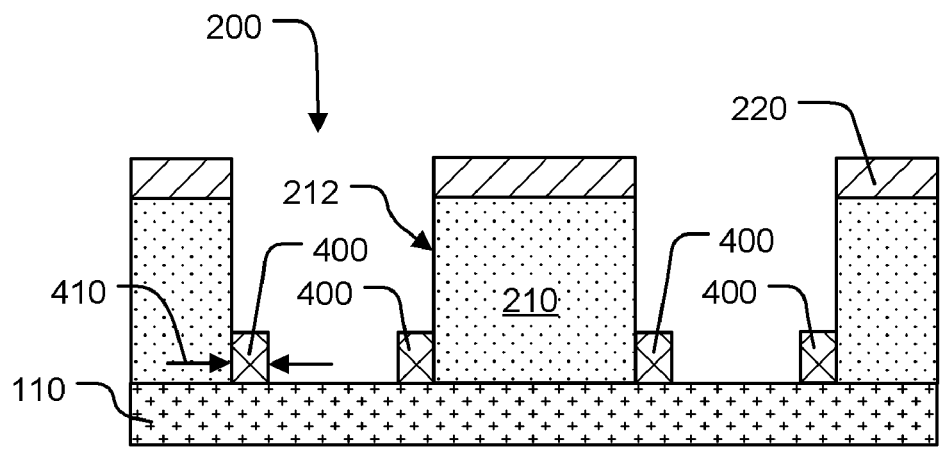
Figure 4B:
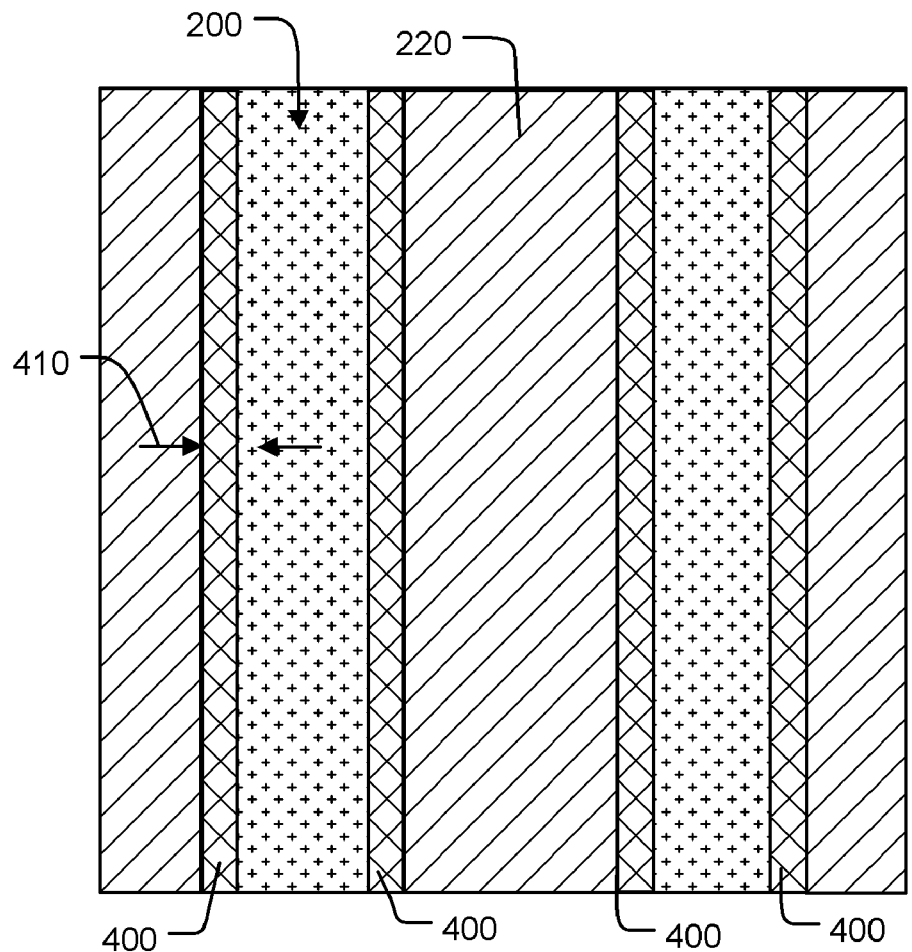

Next, the layer 300 of silicide precursor is anisotropically etched to expose upper portions of the sidewalls 212 of the semiconductor lines 210 and leave remaining strips 400 of silicide precursor along the sidewalls 212 within the trenches 200, resulting in the structure illustrated in the top and cross-sectional views of FIGS. 4A and 4B respectively. The strips 400 of silicide precursor have a width 410.

The anisotropic etching process may be carried out, for example, using Reactive Ion Etching (RIE) adapted for the selected precursor. As discussed in more detail below with respect to FIGS. 21A and 21B, in alternative embodiments the layer 300 may be deposited in a non-conformal manner, and the etching may be carrier out using a wet etch process.

Figure 5A:
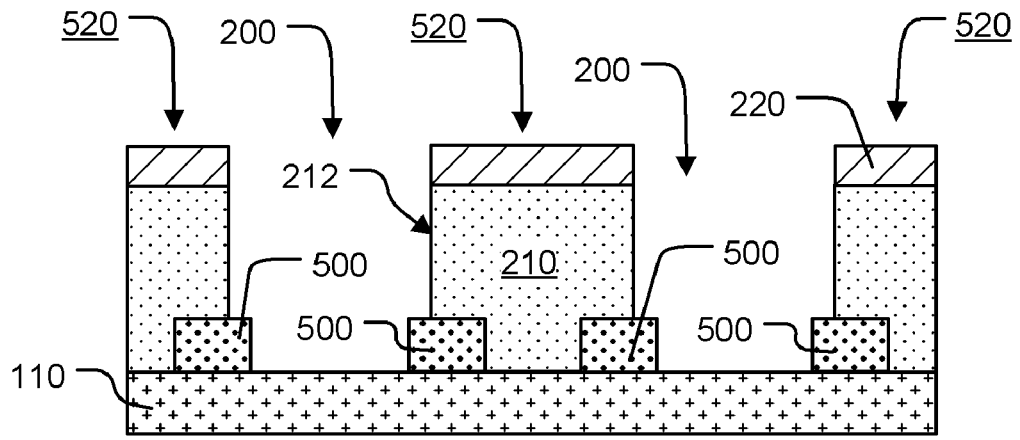
Figure 5B:
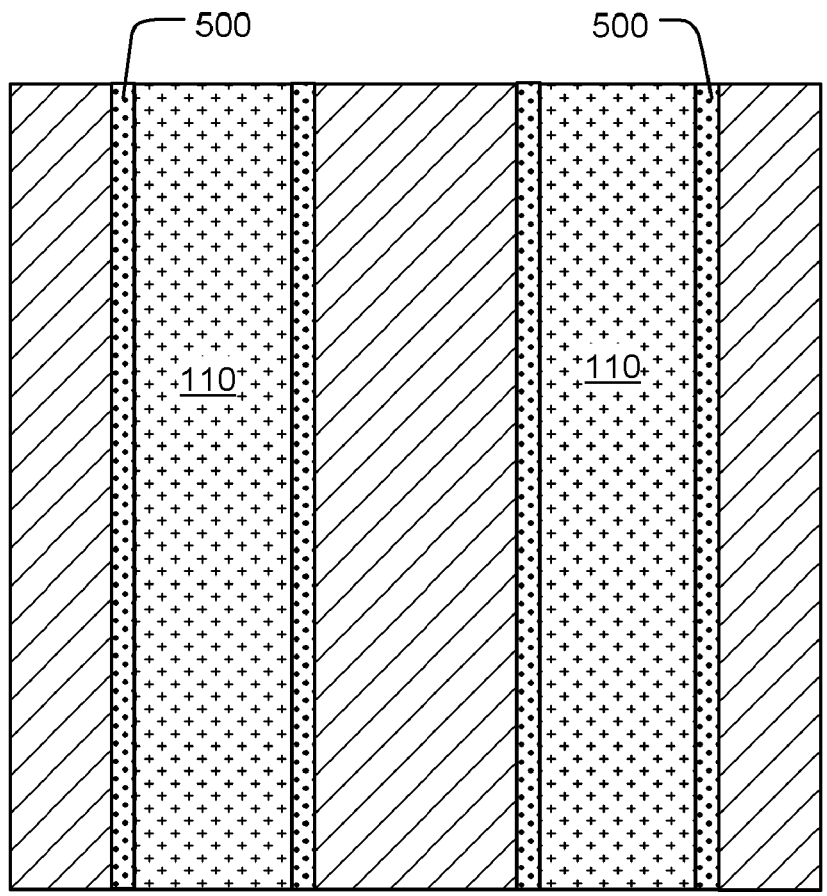

Next, a rapid thermal process (RTP) anneal is performed to induce formation of buried silicide lines 500 by reaction of the strips 400 of silicide precursor with the silicon of the semiconductor lines 210, resulting in the structure illustrated in the top and cross-sectional views of FIGS. 5A and 5B respectively. In the illustrated embodiment the silicide precursor comprises cobalt, so the silicide lines 500 comprise cobalt silicon.

The buried silicide lines 500 and the remaining doped silicon of the semiconductor lines 210 define lines 520 on the insulator layer 110. The silicide lines 500 have a higher electrical conductivity than that of the doped silicon material of the semiconductor lines 210. The higher electrical conductivity of the silicide lines 500 increases the electrical conductivity of the lines 520 and thus reduces the loading effect of the doped silicon material of the semiconductor lines 210.

Since the silicide lines 500 do not consume the top surface of the semiconductor lines 210, the top surface of the silicon material of the semiconductor lines 210 can be utilized in subsequent process steps to form high density stacked structures.

For example, the silicon material can be utilized as vertical access devices such as diodes and transistors in memory arrays, and other vertical device structures.

In the illustrated embodiment of FIGS. 5A-5B, the formation of the buried silicide lines 500 results in two buried silicide lines 500 within each of the semiconductor lines 210, one along each of the sidewalls 212 and separated by remaining silicon material of the lines 210.

Figure 6A:
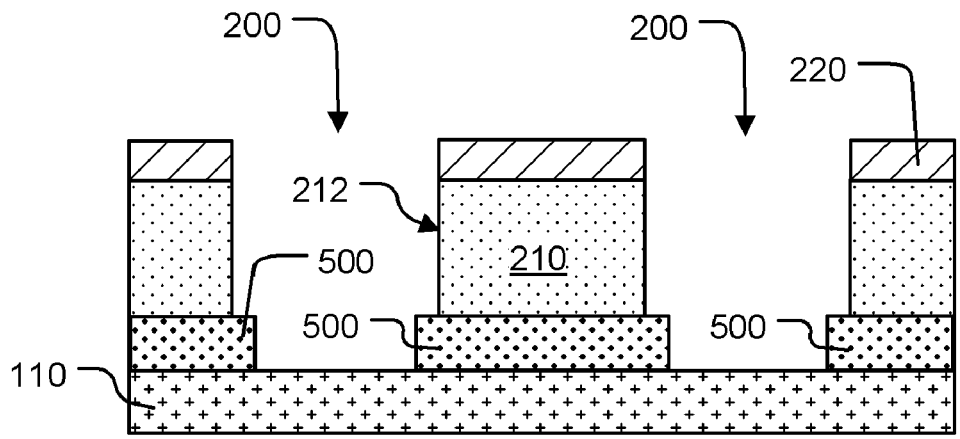
FIGS. 6A-6B illustrate an alternative embodiment to that of FIGS. 5A-5B.
Figure 6B:
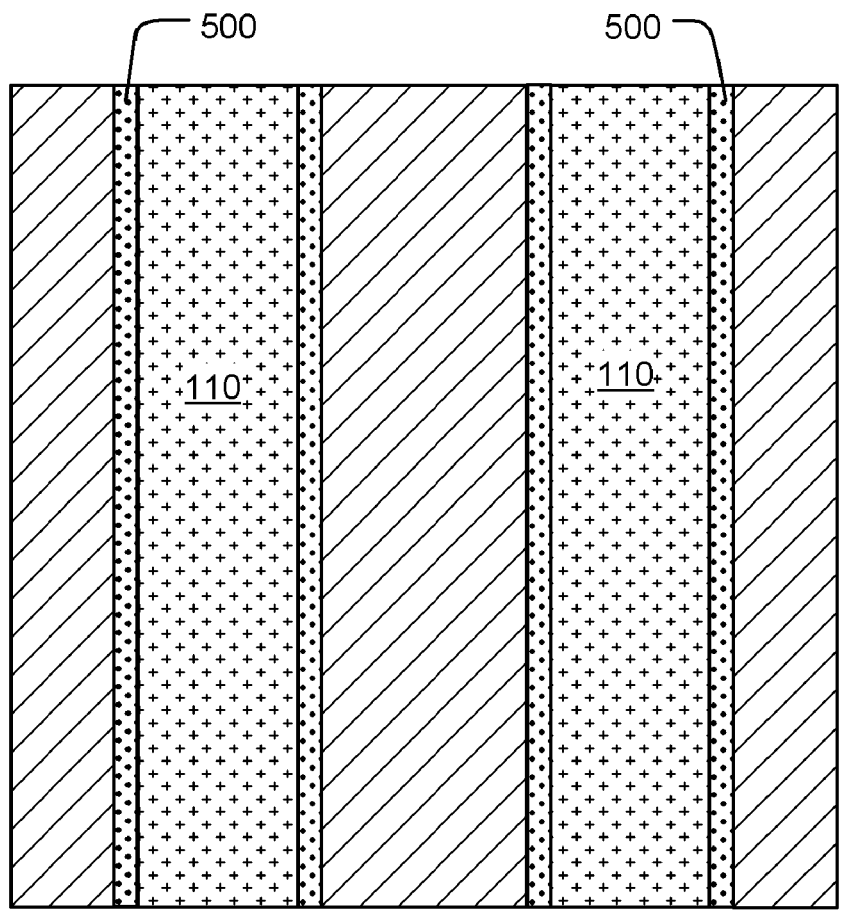

FIGS. 6A and 6B illustrate an alternative embodiment in which the formation of the silicide lines 500 consumes silicon of the semiconductor lines 210 until the silicide conductors 500 extend between adjacent trenches 200. In such an embodiment, the width 410 (See FIGS. 4A and 4B) of the silicide precursor is sufficient to cause silicide formation through at least half the width of the semiconductor lines 210 so that silicide growth into the lines 210 on both sidewalls 212 connects beneath remaining silicon material of the semiconductor lines 210. The width 410 which can be implemented depends upon the particular silicide chosen, and the depth of growth of the silicide into the lines 210.

As a basic reference, typical silicide growth has been characterized as forming silicide that is about 2.5 times thicker than the precursor, with growth into the silicon being about 1.5 times the thickness of the precursor.

Figure 7:
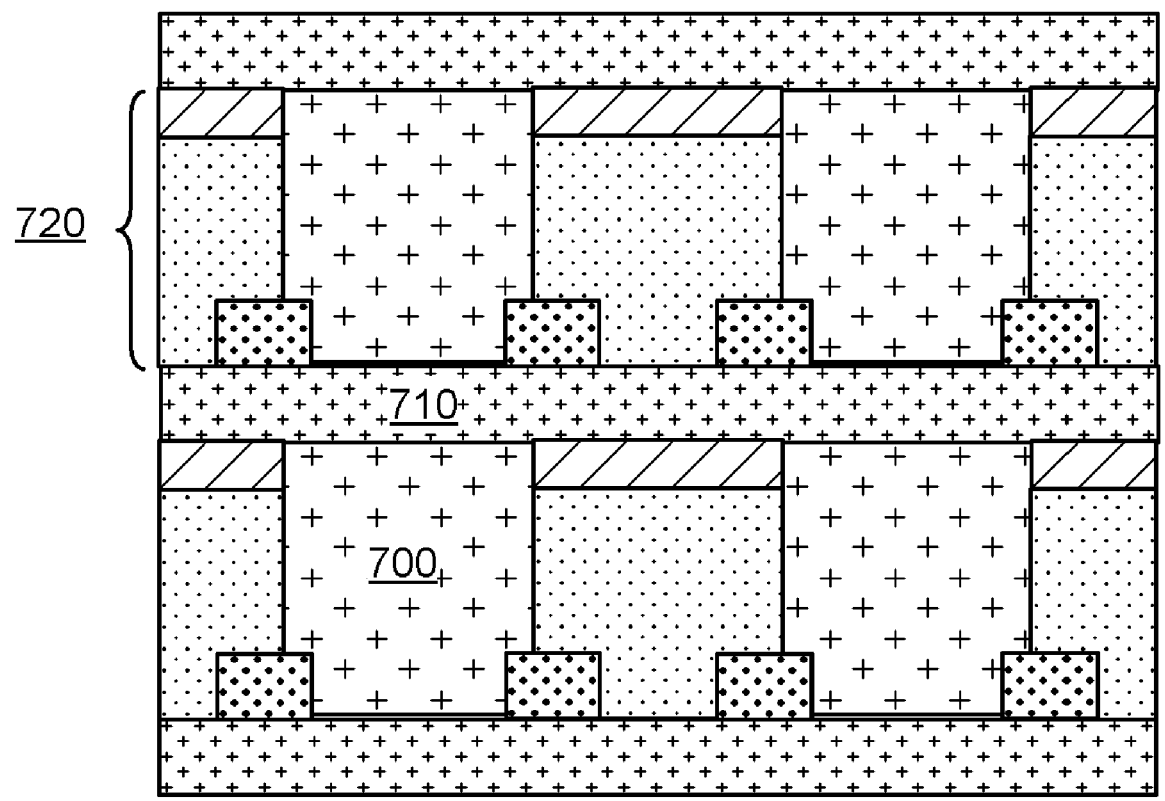
FIG. 7 illustrates a cross-sectional view of applying the steps of FIGS. 1 to 5A-5B to form a stacked structure.

The processes described above for forming the buried silicide lines 500 can be repeated to form stacked structures of buried silicide lines 500. For example, an insulator 700 can be formed within the trenches 200 of the structure of FIGS. 5A-5B, and an insulator layer 710 can be formed on the resulting structure. The processes described above with reference to FIGS. 1 to 5A-5B can then be repeated to form a second layer structure 720, resulting in the structure illustrated in the cross-sectional view of FIG. 7.

The method for forming the buried silicide lines 500 discussed above with reference to FIGS. 1 to 5A-5B can be applied to form a stacked reprogrammable memory cell array having diode access devices, as described below with respect to FIGS. 8 to 16A-16B.

Figure 8:
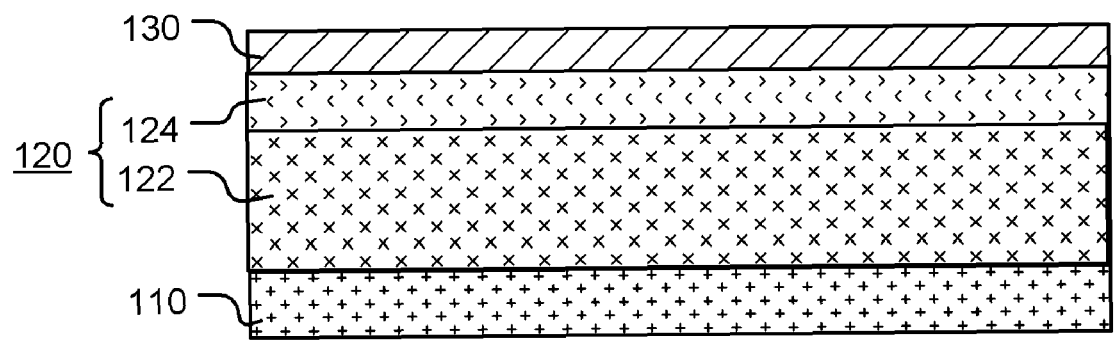

FIG. 8 illustrates a cross-sectional view of forming a semiconductor body 800 by forming a layer of doped silicon 120 on an insulator layer 110, and forming a protection layer 130 on the layer of doped silicon 120. In the illustrated embodiment the layer of doped silicon 120 includes a lower portion 122 and an upper portion 124.

The lower portion 122 has a conductivity type opposite that of the upper portion 124. For example, if the lower portion 122 of the layer of doped silicon 120 has a p-type conductivity with a concentration sufficient to form an anode of a diode structure, the upper portion is implanted with an n-type dopant with an energy and concentration sufficient to form a cathode of a diode structure.

Figure 9A:
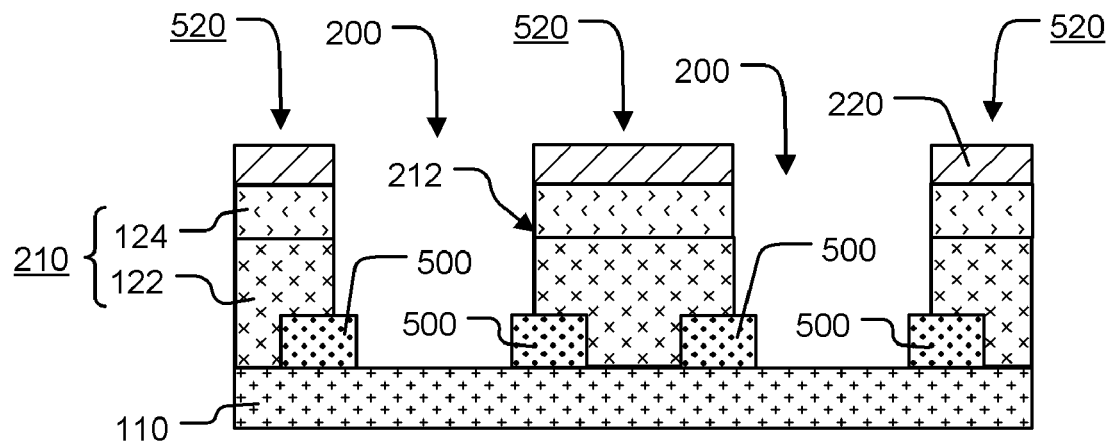
Figure 9B:
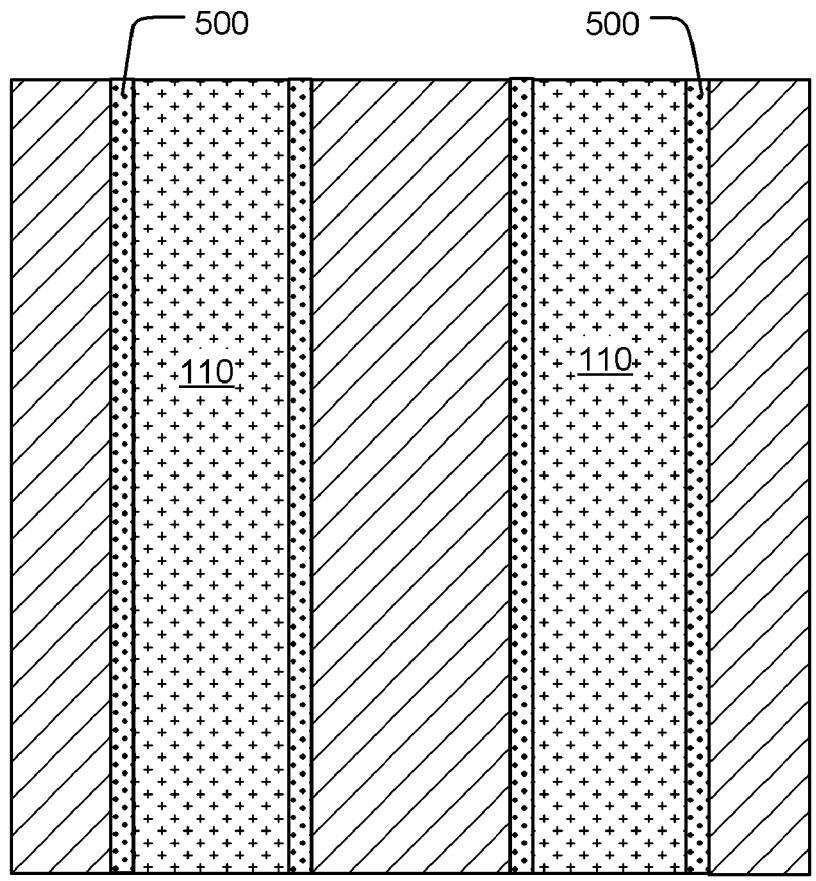

Next, the processes of FIGS. 2A-2B through FIGS. 5A-5B can be carried out on the structure illustrated in FIG. 8, resulting in the structure having buried silicide lines 500 as illustrated in the cross-sectional and top views of FIGS. 9A and 9B respectively.

As can be seen in the cross-sectional view of FIG. 9A, the semiconductor lines 210 include material of the upper portion 124 on material of the lower portion 122 of the layer of silicon 120. The etching of the silicide precursor leaves the remaining strips of silicide precursor below a top surface of the lower portion 122 of the layer of silicon 120. As a result, following the RTP anneal process the buried silicide lines 500 are formed within the lower portion 122 as shown in FIG. 9A.

The buried silicide lines 500 and the remaining doped silicon of the semiconductor lines define lines 520 on the insulator layer 110. The silicide lines 500 have a higher electrical conductivity than that of the doped silicon material of the semiconductor lines 210. The higher electrical conductivity of the silicide lines 500 increases the electrical conductivity of the lines 520 and thus reduces the loading effect of the doped silicon material of the semiconductor lines 210.

In the illustrated embodiment of FIGS. 9A-9B, the formation of the buried silicide lines 500 results in two buried silicide lines 500 within each of the semiconductor lines 210, one along each of the sidewalls 212 and separated by remaining silicon material of the lines 210.

Figure 9C:
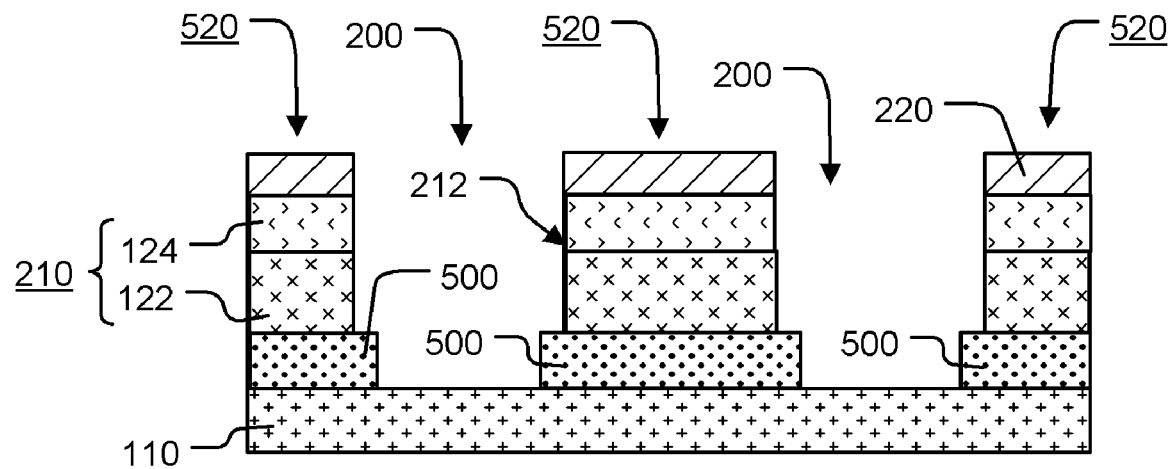
Figure 9D:
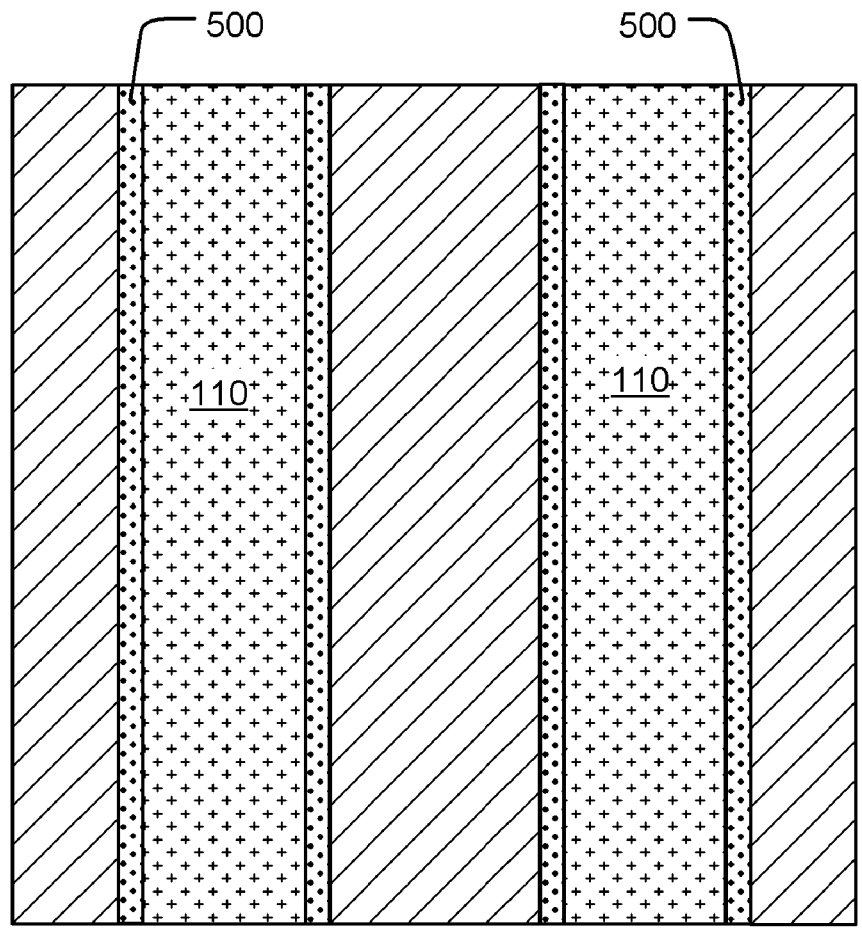

FIGS. 9C and 9D illustrate an alternative embodiment in which the formation of the silicide lines 500 consumes silicon of the semiconductor lines 210 until the silicide conductors 500 extend between adjacent trenches 200. In such an embodiment, the width 410 (See FIGS. 4A and 4B) of the silicide precursor is sufficient to cause silicide formation through at least half the width of the semiconductor lines 210 so that silicide growth into the lines 210 on both sidewalls 212 connects beneath remaining silicon material of the semiconductor lines 210. The width 410 which can be implemented depends upon the particular silicide chosen, and the depth of growth of the silicide into the lines 210.

Figure 10A:
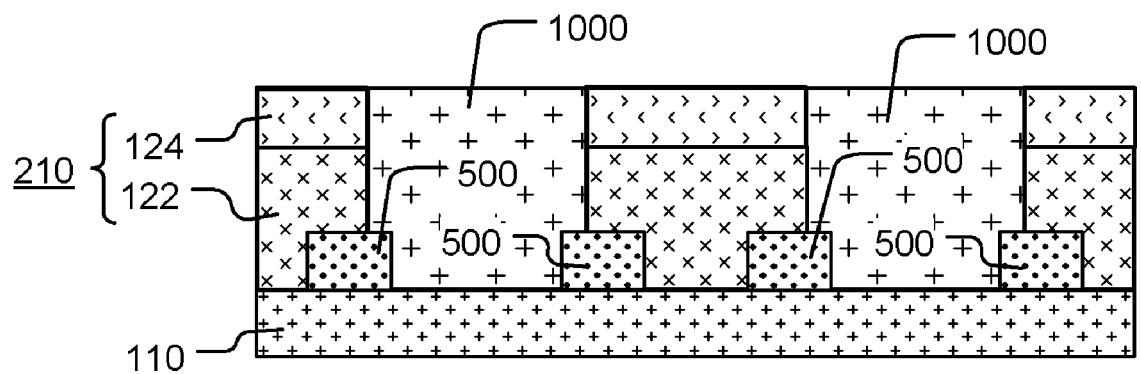
Figure 10B:
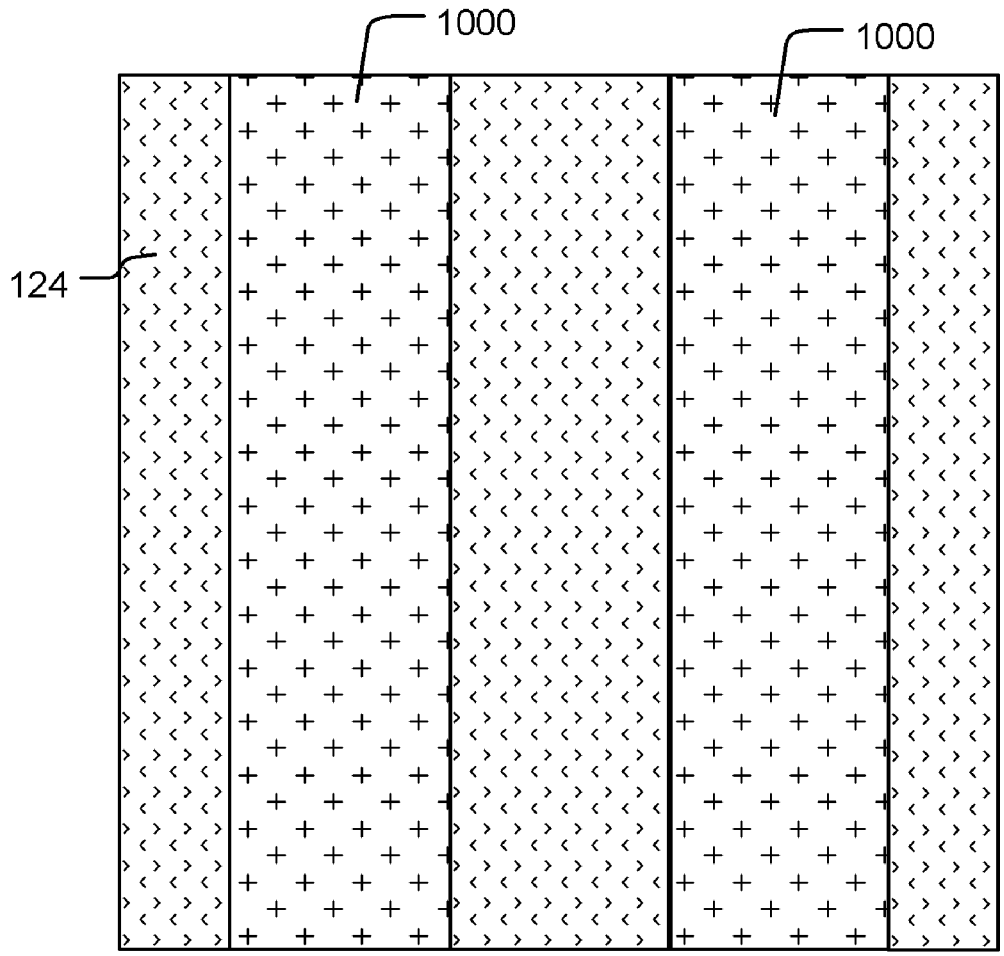

Referring back to the structure of FIGS. 9A-9B, next the trenches 200 are filled with insulator material 1000 and lines 220 comprising material of the protection layer 130 removed, resulting in the structure illustrated in the top and cross-sectional views of FIGS. 10A and 10B respectively.

The trenches 200 can be filled by depositing the insulator material 1000 on the structure illustrated in FIGS. 9A-9B, followed by a planarization process such as chemical mechanical polishing (CMP) to remove the lines 220.

Figure 11A:
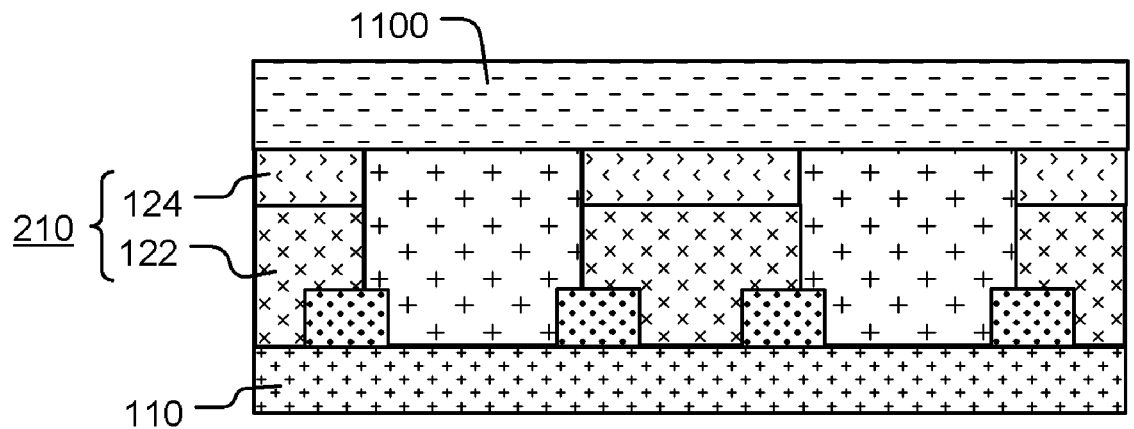
Figure 11B:
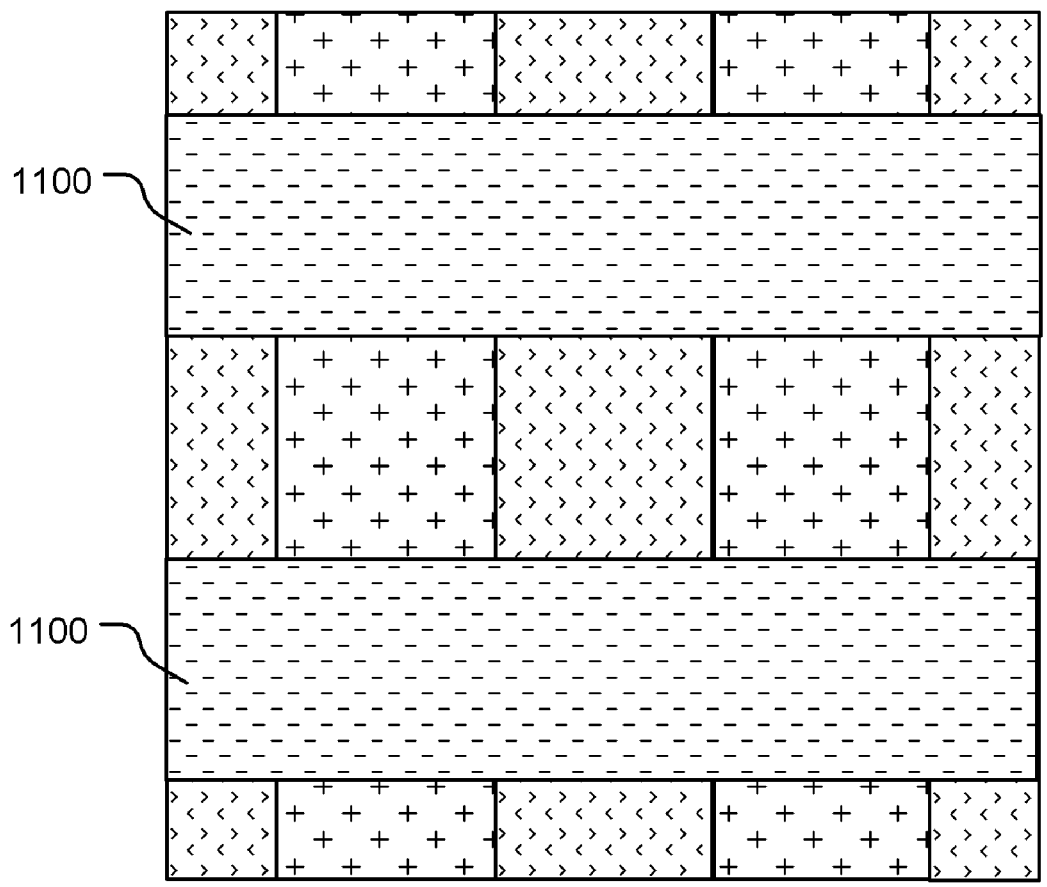

Next, an etch mask 1100 is patterned on the structure illustrated in FIGS. 10A-10B, resulting in the structure illustrated in the top and cross-sectional views of FIGS. 11A and 11B respectively. In the illustrated embodiment the etch mask 1100 comprises a patterned layer of photoresist.

In some embodiments, a silicide process is performed prior to the formation of the etch mask 1100 to form conductive lines comprising silicide on the upper portion 124 of the semiconductor lines 210. The conductive lines may comprise, for example, a silicide containing Ti, W, Co, Ni, or Ta. The conductive lines can provide for a low resistance contact between the upper portion 124 and the subsequently formed electrode (See, reference number 250, FIGS. 14A and 14B).

Figure 12A:
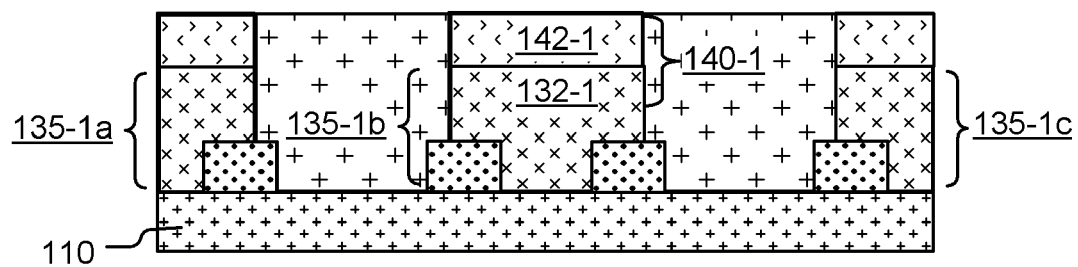
Figure 12B:
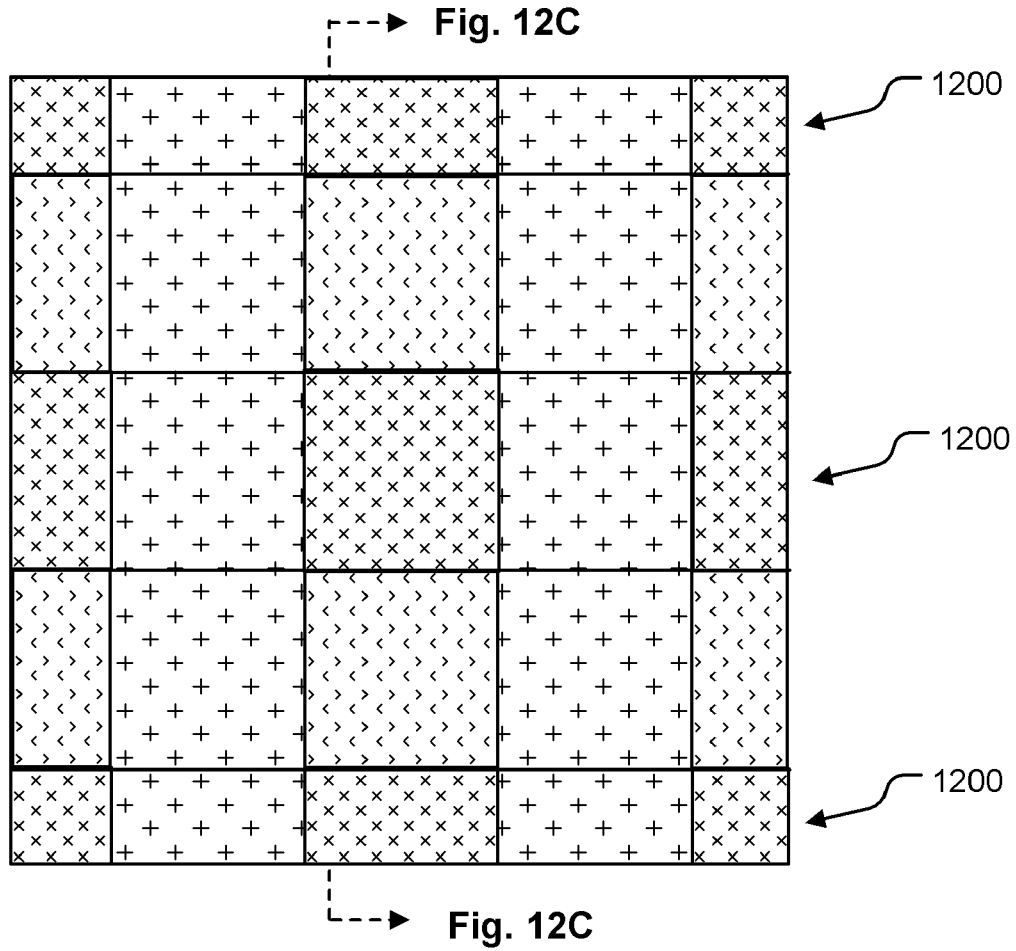
Figure 12C:
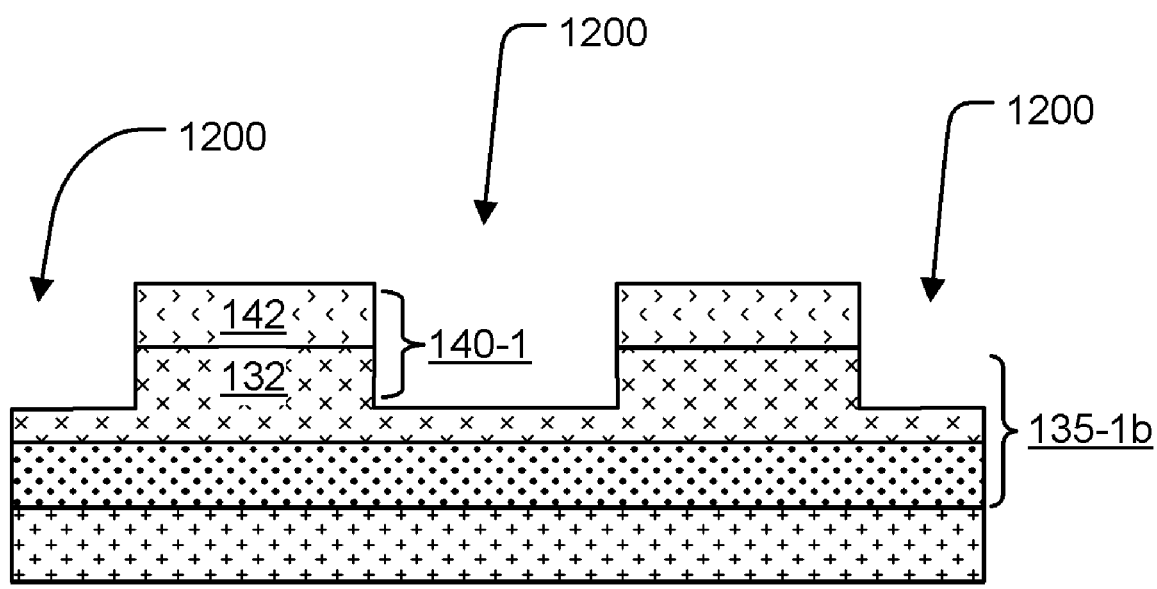

Next, the structure of FIGS. 11A-11B is etched using the etch mask 1110 to form trenches 1200 extending below the top surfaces of the lower portion 122 of the semiconductor lines 120 to form word lines 135-1, resulting in the cross-sectional views of FIGS. 12A and 12C and the top view of FIG. 12B. The word lines 135-1 include the remaining material of the lower portion 122 of the semiconductor lines 120, and the buried silicide lines 500.

As can be seen in the cross-sectional views of FIGS. 12A and 12C, the tranches 1200 extend below the top surfaces of the lower portion 122 of the semiconductor lines 122 to define diodes 140-1 along the word lines 135-1. The first node 142-1 of the diode 140-1 comprises remaining material of upper portion 124, and the second node 132-1 comprises material of the lower portion 122 of the word line 135-1 underlying the first node 142-1.

Figure 13A:
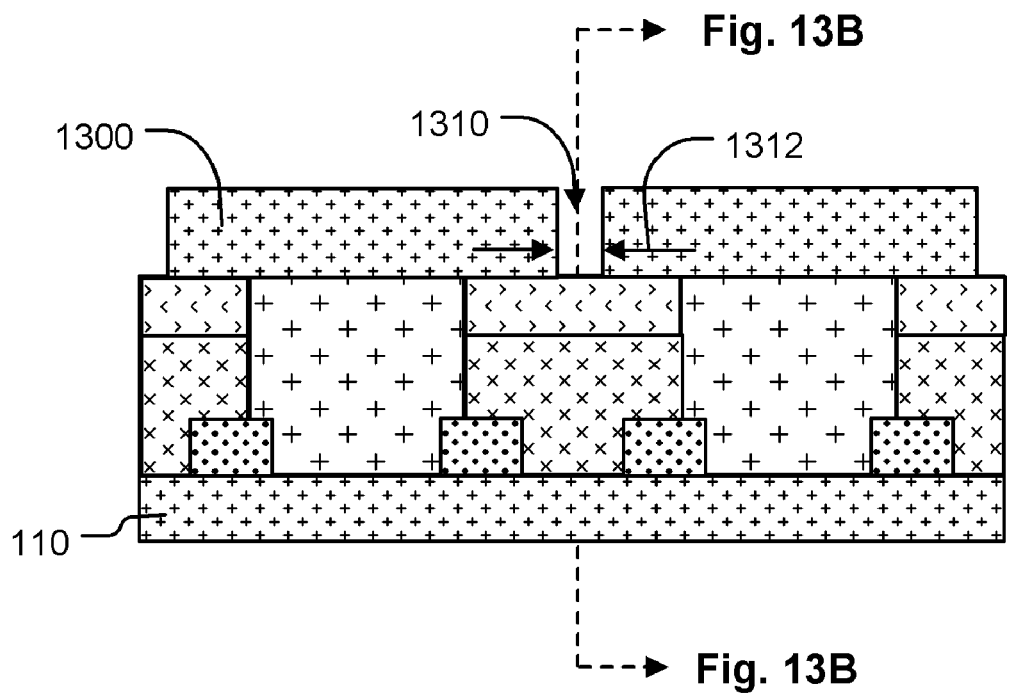
Figure 13B:
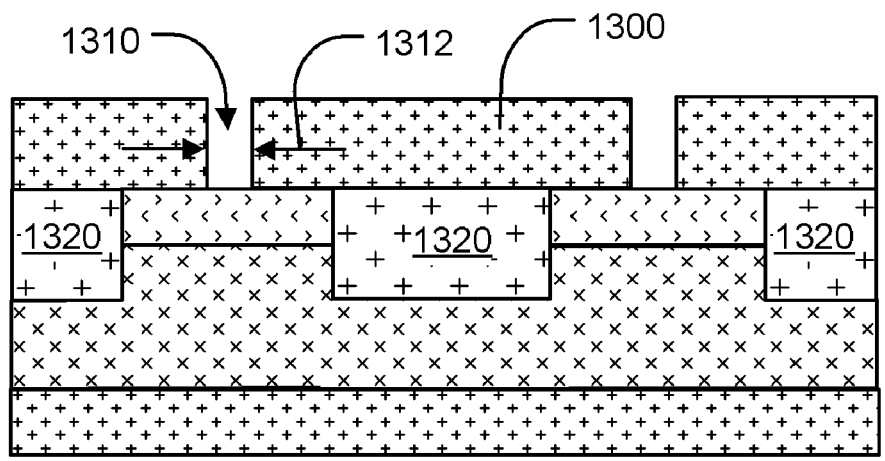

Next, the trenches 1200 are filled with insulator material 1320, and an insulator layer 1300 having openings 1310 are formed to expose portions of the first node 142-1 of the diode 140-1, resulting in the structure illustrated in the cross-sectional views of FIGS. 13A and 13B.

The openings 1310 having sublithographic widths 1312 can be formed, for example, by forming an isolation layer on the insulator layer 1300 and forming a sacrificial layer on the isolation layer. Next, a mask having openings close to or equal to the minimum feature size of the process used to create the mask is formed on the sacrificial layer, the openings overlying the locations of the openings 1310. The isolation layer and the sacrificial layer are then selectively etched using the mask, thereby forming vias in the isolation and sacrificial layers and exposing a top surface of the insulator layer 1300. After removal of the mask, a selective undercutting etch is performed on the vias such that the isolation layer is etched while leaving the sacrificial layer and the insulator layer 1300 intact. A fill material is then formed in the vias, which due to the selective undercutting etch process results in a self-aligned void in the fill material being formed within each via. Next, an anisotropic etching process is performed on the fill material to open the voids, and etching continues until the insulator layer 1300 is exposed in the region below the vias, thereby forming a sidewall spacer comprising fill material within each via. The sidewall spacers have an opening dimension substantially determined by the dimensions of the voids, and thus can be less than the minimum feature size of a lithographic process. Next, the insulator layer 1300 is etched using the sidewall spacers as an etch mask, thereby forming openings having a widths less than the minimum lithographic feature size. The isolation layer and the sacrificial layer can be removed by a planarization process such as CMP. See, for example, U.S. Pat. No. 7,351,648 and U.S. patent application Ser. No. 11/855979, which are incorporated by reference herein.

Figure 14A:
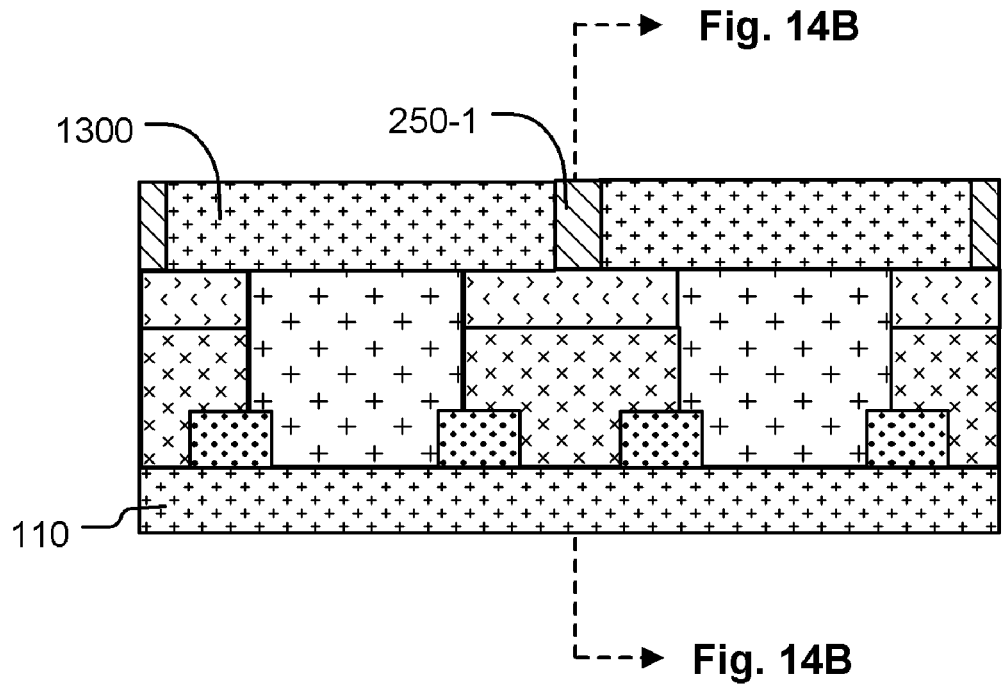
Figure 14B:
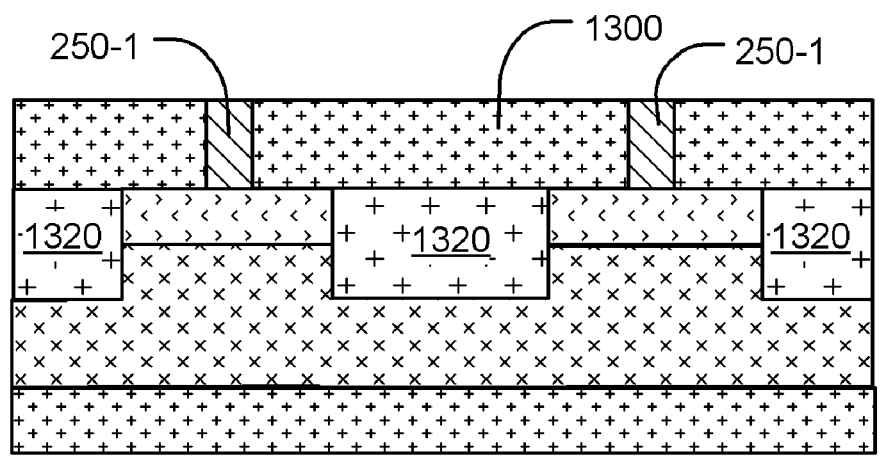

Next, electrodes 250-1 are formed within the openings 1310, resulting in the structure illustrated in the cross-sectional views of FIGS. 14A and 14B. The electrodes 250-1 can be formed, for example, by depositing electrode material within the openings 1310 in the insulator layer 1300 using Chemical Vapor Deposition, followed by a planarizing process such as CMP. In embodiments in which the openings are formed using an isolation layer and a sacrificial layer as described above, in alternative embodiments the electrode material may be deposited within the openings and overlying the isolation layer and the sacrificial layer. A subsequent planarization process such as CMP can then remove the isolation layer and the sacrificial layer.

The electrodes 250-1 may comprise, for example, TiN or TaN. TiN may be preferred in embodiments in which subsequently formed memory material comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

Next, a memory material layer is formed on the electrodes 250-1, and conductive bit line material is formed on the memory material layer. The memory material layer may comprise, for example, one or more materials from the group of Ge, Sb, Te, Se, In, Ti, Ga, Bi, Sn, Cu, Pd, Pb, Ag, S, Si, O, P, As, N and Au.

The memory material layer and the bit line material are then patterned to form strips 1500 of memory material and bit lines 145-1 on the strips 1500. An insulator material 1520 is then formed between the strips 1500 and bit lines 145-1, resulting in the formation of a first array of memory cells 102-1 having a plurality of memory cells as illustrated in the cross-sectional views of FIGS. 15A and 15B. The bit lines 145-1 comprise conductive material such as one or more of the materials described above with reference to the electrode 250-1.

Figure 15A:
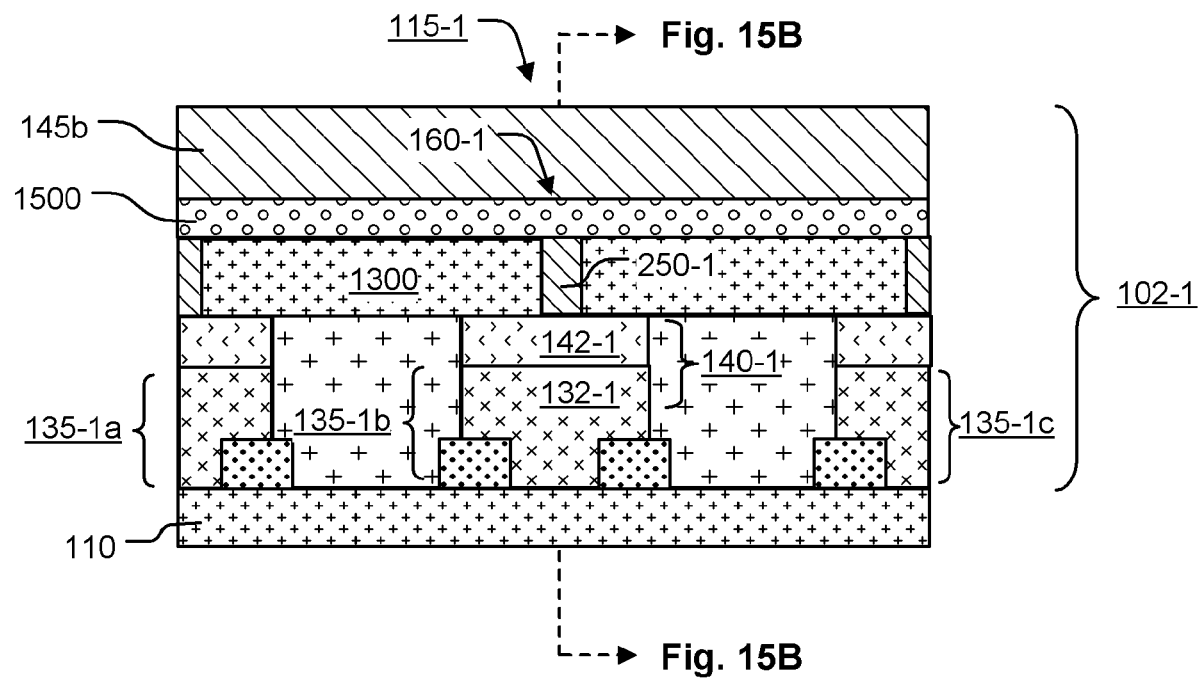
Figure 15B:
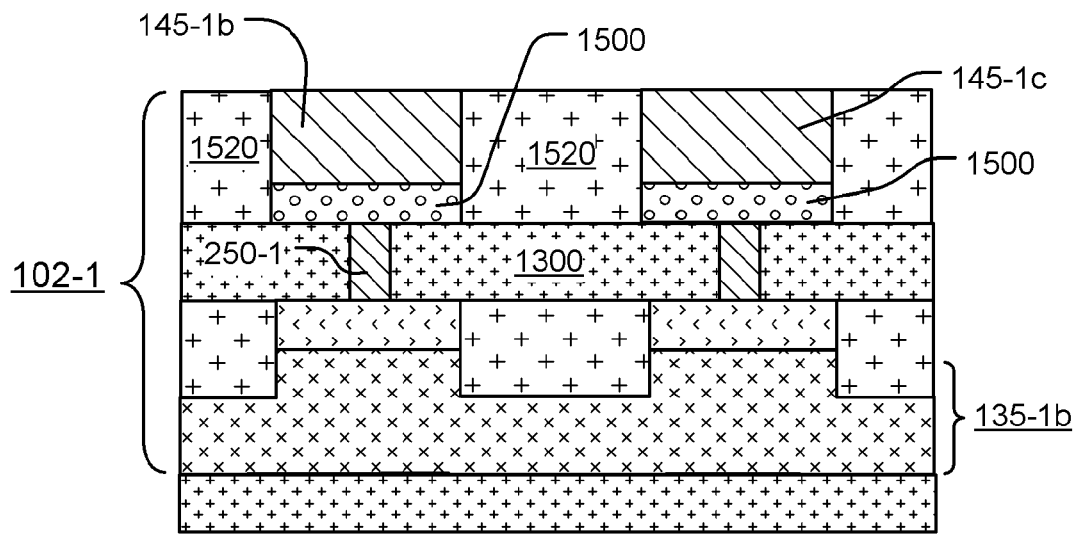
Figure 16A:
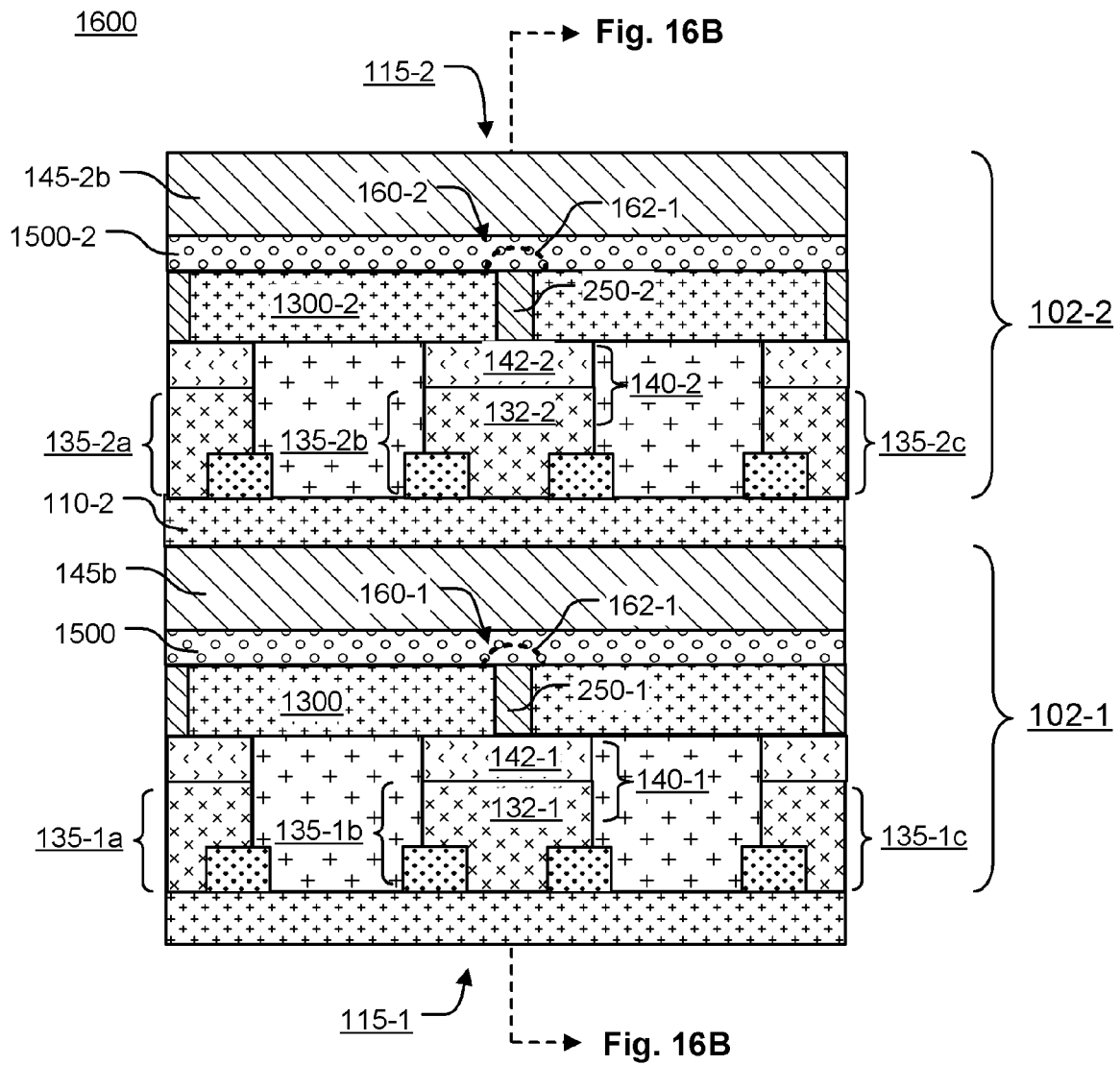
Figure 16B:
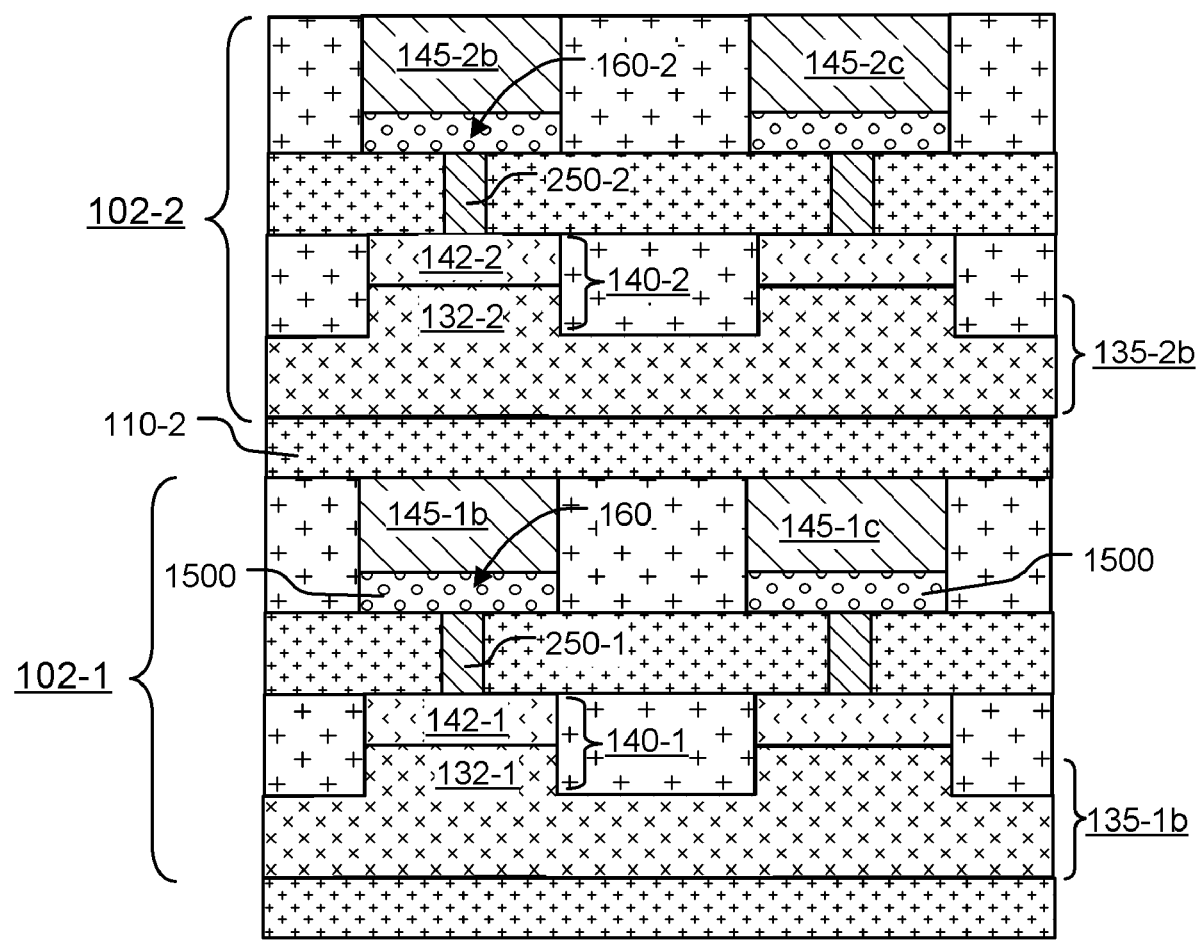

Next, an insulator layer 110-2 is formed on the structure illustrated in FIGS. 15A-15B, and the processes of FIGS. 8-15 can be carried out to form a second array of memory cells 102-2 overlying the first array of memory cells 102-1, resulting in the stacked memory cell array 1600 as illustrated in the cross-sectional views of FIGS. 16A and 16B.

Memory cell 115-1 is representative of the memory cells of the first array 102-1 and is arranged at the cross-point location of the bit line 145-1$b$ and the word line 135-1$b$. The memory cell 115-1 includes diode 140-1 and memory element 160-1 arranged in series. Bottom electrode 250-1 extends through insulator layer 1300 to couple the diode 140-1 to memory element 160 comprising a portion of memory material strip 1500 underlying bit line 145-1$b$.

In operation, voltages on the word line 135-1$b$ and bit line 145-1$b$ can induce a current through the memory element 160-1, electrode 250-1, and the diode 140-1. The active region 162-1 is the region of the memory element 160-1 in which the memory material is induced to change between at least two solid phases.

Memory cell 115-2 overlies memory cell 115-1 and is representative of the memory cells of the second array 102-2. Memory cell 115-2 is arranged at the cross-point location of the bit line 145-2$b$ and the word line 135-2$b$. The memory cell 115-2 includes a diode 140-2 and a memory element 160-2 arranged in series. Bottom electrode 250-2 extends through insulator layer 1300-2 to couple the diode 140-2 to memory element 160-2 comprising a portion of memory material strip 1500-2 underlying bit line 145-2$b$.

In operation, voltages on the word line 135-2$b$ and bit line 145-2$b$ can induce a current through the memory element 160-2, electrode 250-2, and the diode 140-1. The active region 162-2 is the region of the memory element 160-2 in which the memory material is induced to change between at least two solid phases.

In FIGS. 16A-16B, the active regions of the memory elements have a "mushroom" shape adjacent the underlying electrode, and thus the configuration of the memory elements and the electrode 250 is commonly referred to as a mushroom-type configuration. Alternatively, other types of configurations can be used.

Figure 16C:
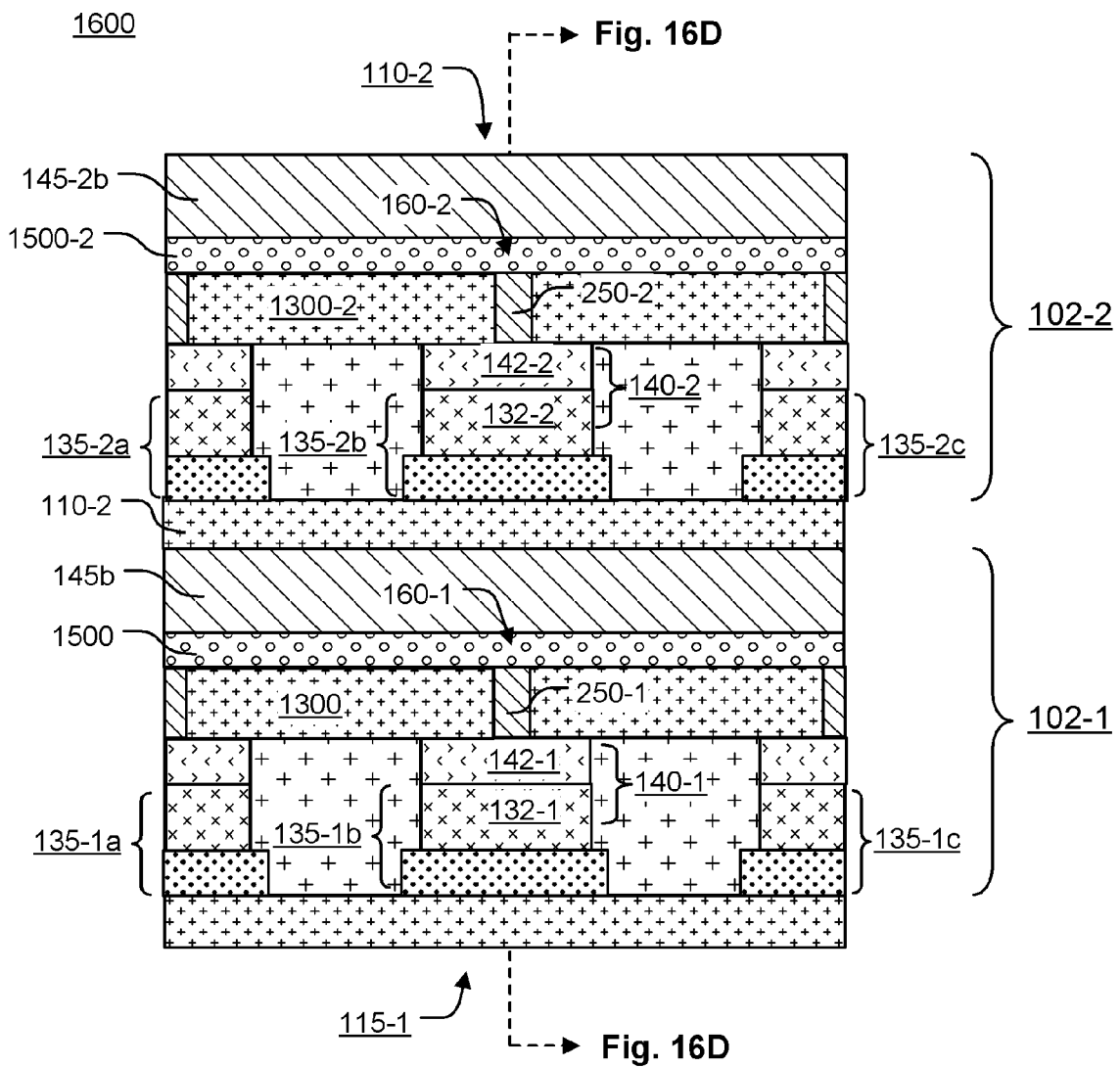
FIGS. 16C-16D illustrate an alternative embodiment to that of FIGS. 16A-16B.
Figure 16D:
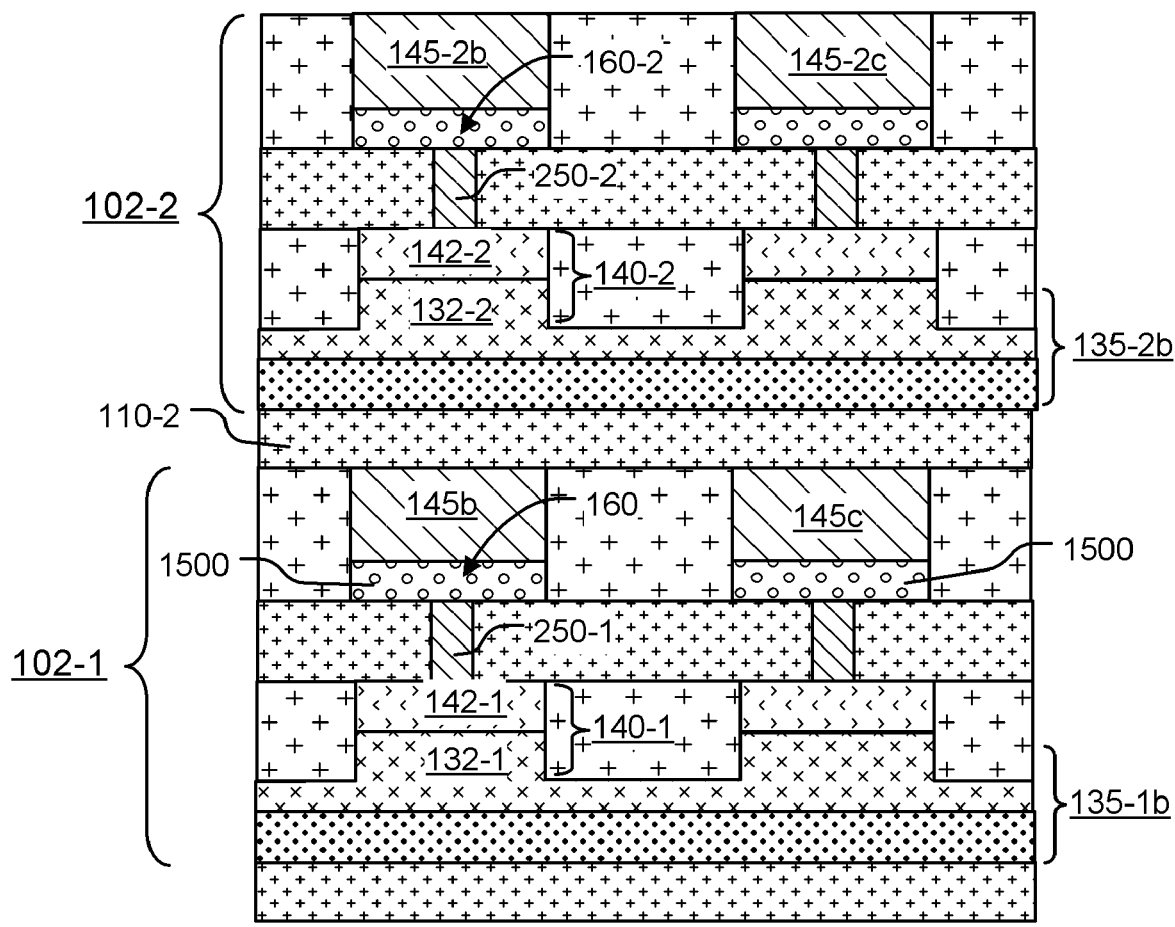

In the illustrated embodiment of FIGS. 16A-16B, the word lines 135 each include two buried silicide lines 500. FIG. 16C-16B illustrate an alternative embodiment made using the process of FIGS. 9C-9D, in which the word lines 135 each include a single buried silicide line 500 extending the width of the word lines 135.

Figure 17:
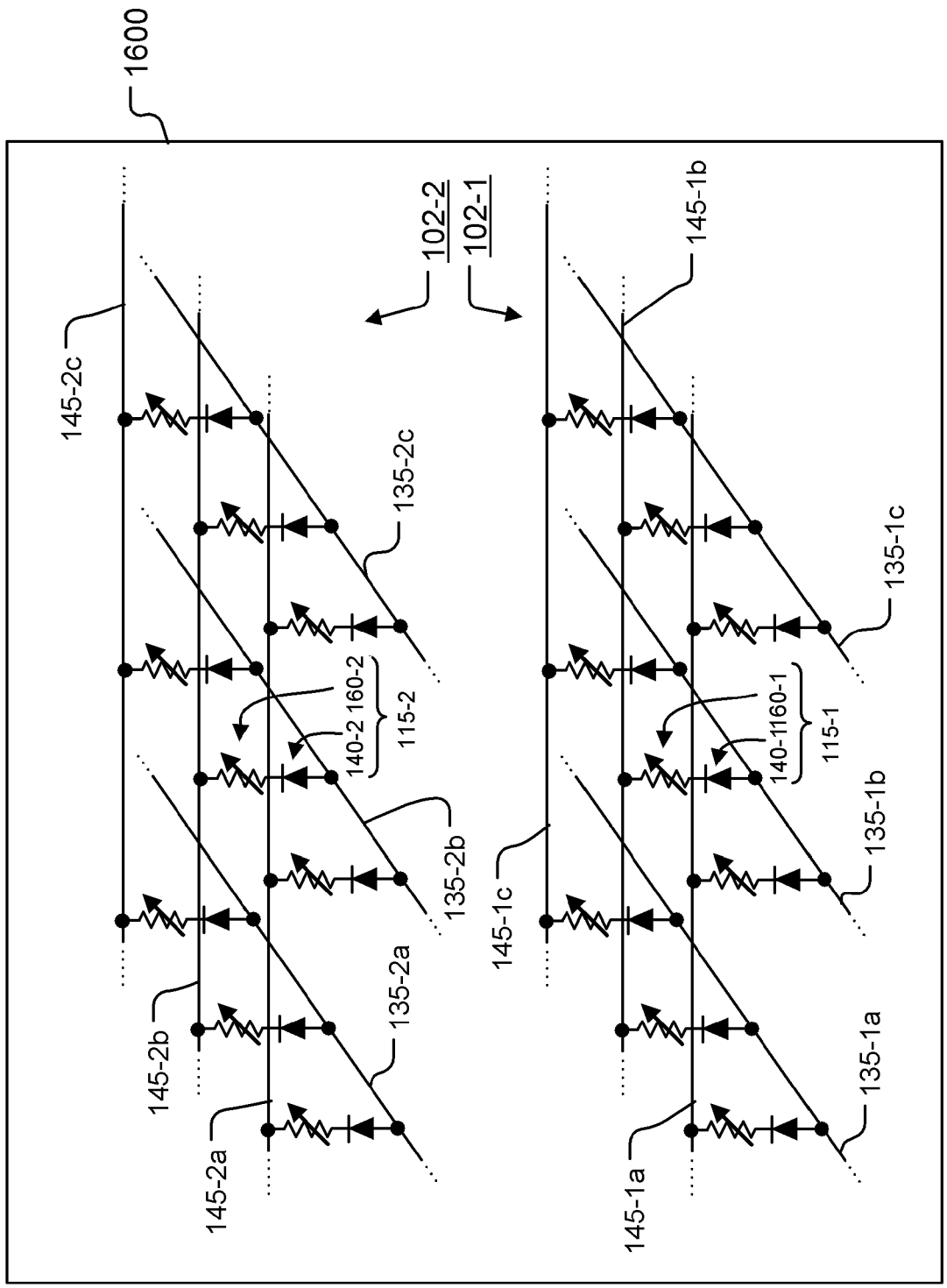
FIG. 17 illustrates a schematic diagram of the stacked memory cell array of FIG. 16.

FIG. 17 illustrates a schematic diagram of the stacked memory cell array 1600 of FIG. 16.

The array 1600 includes a plurality of arrays 102 including the first array of memory cells 102-1 underlying the second array of memory cells 102-2.

As shown in FIG. 17, each of the memory cells of the array 1600 includes a diode access device and a memory element (represented in FIG. 1 by a variably resistor) capable of being programmed to one of a plurality of resistive states and thus capable of storing one or more bits of data.

The word lines 135 and the bit lines 145 of the various arrays 102 are arranged in such a manner that a given word line 135 and a given bit line 145 cross over each other but do not physically intersect, and the memory cells are located at these cross-point locations of the word lines 135 and bit lines 145.

The first array 102-1 includes the word lines 135-1 including word lines 135-1a, 135-1b, 135-1c extending in parallel in a first direction, and the bit lines 145-1 including bit lines 145-1a, 145-1b, and 145-1c overlying the word lines 135-1 and extending in parallel in a second direction perpendicular to the first direction.

The second array 102-2 includes word lines 135-2 including word lines 135-2a, 135-2b, 135-2c extending in parallel in the first direction, and the bit lines 145-2 including 145-2a, 145-2b, and 145-2c extending in parallel in the second direction.

Reading or writing to memory cells of the array 1600 can be achieved by applying appropriate voltages and/or currents to the corresponding word line 135 and bit line 145 to induce a current through a selected memory cell. The level and duration of the voltages/currents applied is dependent upon the operation performed, e.g. a reading operation or a writing operation. In the example memory cell 115-1 is the selected memory cell.

In a reset (or erase) operation of memory cell 115-1 with memory element 160-1 comprising phase change material, a reset bias arrangement is applied to the corresponding word line 135-1b and bit line 145-1b to cause a transition of an active region of the phase change material from a crystalline into an amorphous phase, thereby setting the phase change material to a resistance within a resistive value range associated with the reset state. The reset bias arrangement is a relatively high energy pulse, sufficient to raise the temperature of at least the active region of the memory element 160 above the transition (crystallization) temperature of the phase change material and also above the melting temperature to place at least the active region in a liquid state. The reset bias arrangement is then quickly terminated, resulting in a relatively quick quenching time as the active region quickly cools to below the transition temperature so that the active region stabilizes to an amorphous phase.

In a set (or program) operation of memory cell 115-1 with memory element 160-1 comprising phase change material, a program bias arrangement is applied to the corresponding word line 135-1b and bit line 145-1b of suitable amplitude and duration to induce a current sufficient to raise the temperature of at least a portion of the active region above the transition temperature and cause a transition of a portion of the active region from the amorphous phase into a crystalline phase, this transition lowering the resistance of the memory element 160-1 and setting the memory cell 115-1 to the desired state.

In a read (or sense) operation of the data value stored in memory cell 115-1 having memory element 160-1 comprising phase change material, a read bias arrangement is applied to the corresponding word line 130b and bit line 120b of suitable amplitude and duration to induce current to flow that does not result in the memory element 160-1 undergoing a change in resistive state. The current through the memory cell 115-1 is dependent upon the resistance of the memory element 160-1 and thus the data value stored in the memory cell 115-1.

In FIGS. 1 to 5A-5B, the buried silicide lines were formed within a layer of silicon on an insulator layer.

FIGS. 18A-18B to 23A-23B illustrate an alternative embodiment to that of FIGS. 1 to 5A-5B for manufacturing buried silicide lines to reduce the loading effect of doped silicon material.

Figure 18A:
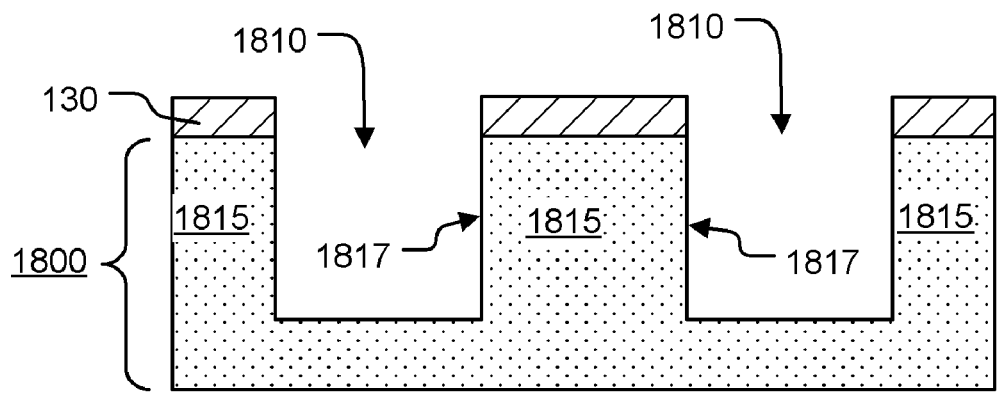
FIGS. 18A-18B to 23A-23B illustrate an alternative embodiment to that FIGS. 1 to 5A-5B for manufacturing buried silicide lines.
Figure 18B:
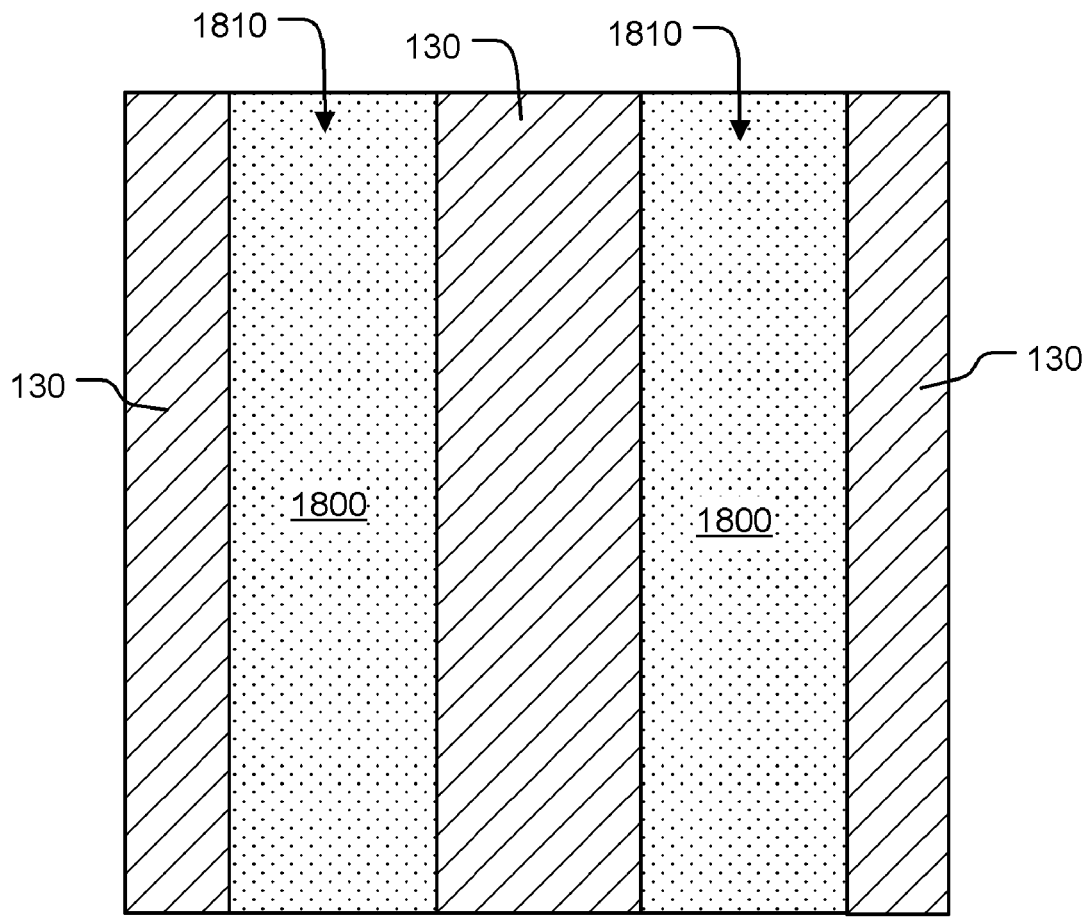

FIGS. 18A-18B illustrate cross-sectional and top views of a step of forming protection layer 130 on a silicon substrate 800, and forming a plurality of trenches 1810 through the protection layer 130 and into the semiconductor substrate 1800. The silicon substrate 1800 may be formed, for example, by an epitaxial process. The silicon substrate 1800 may be a single crystalline silicon.

The trenches 1810 define semiconductor lines 1815 comprising silicon material of the silicon substrate 1800 and have sidewalls 1817.

Figure 19A:
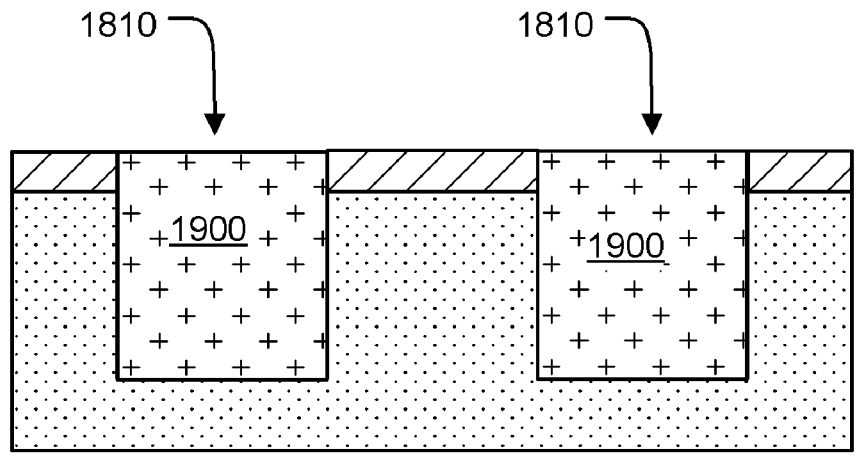
Figure 19B:
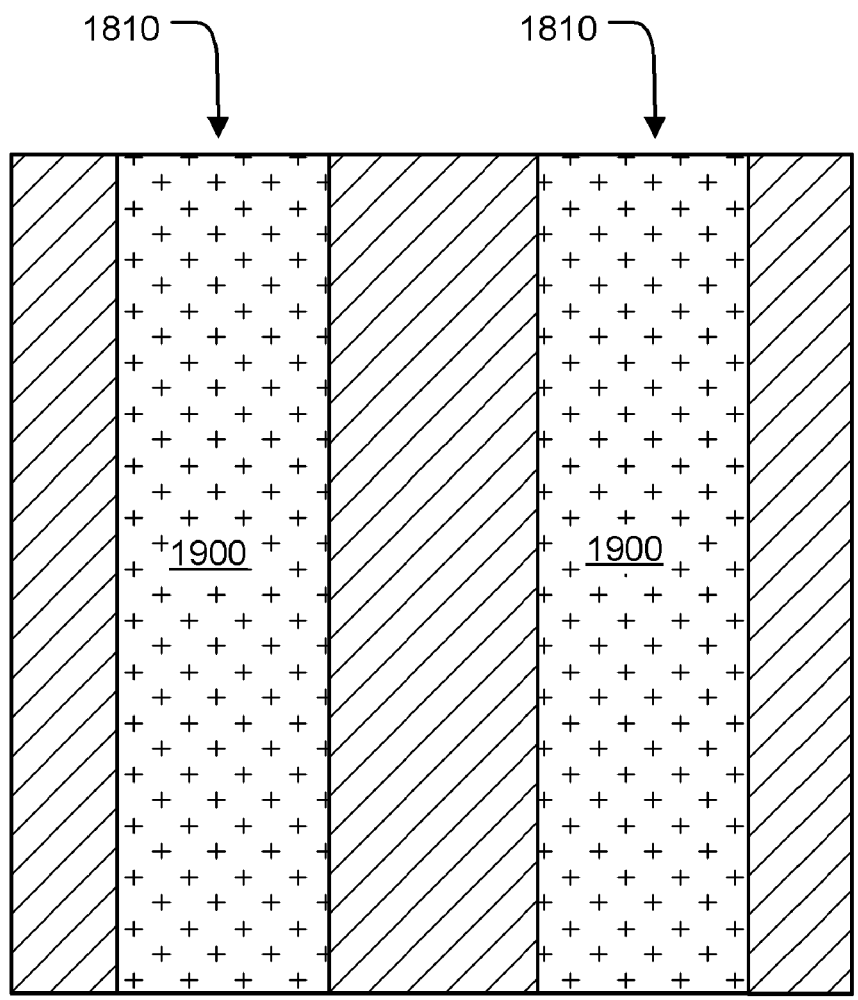

Next, the trenches 1810 are filled with an insulator material 1900, resulting in the structure illustrated in the cross-sectional and top views of FIGS. 19A and 19B respectively. The insulator material 1900 can be formed, for example, using a high-density plasma (HDP) deposition process, followed by a planarization process such as Chemical Mechanical Polishing (CMP). In the illustrated embodiment the insulator material 1900 comprises silicon dioxide.

Figure 20A:
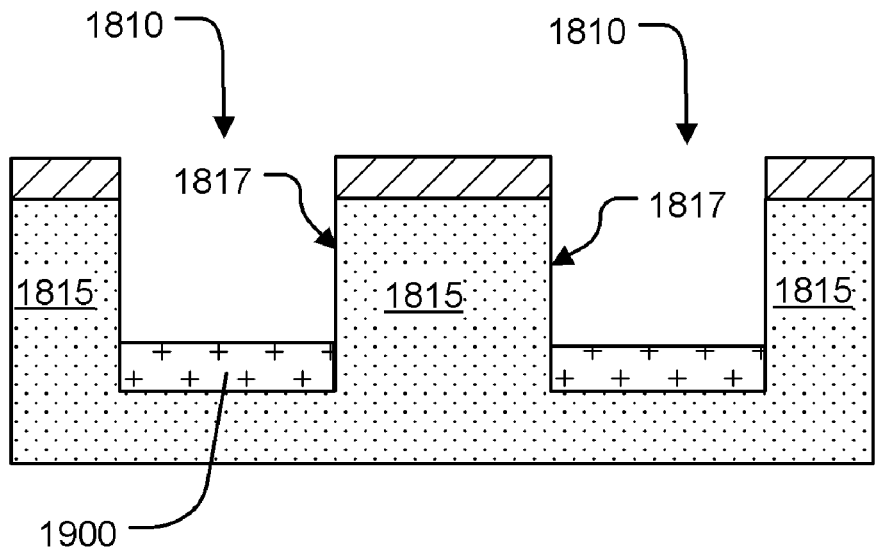
Figure 20B:
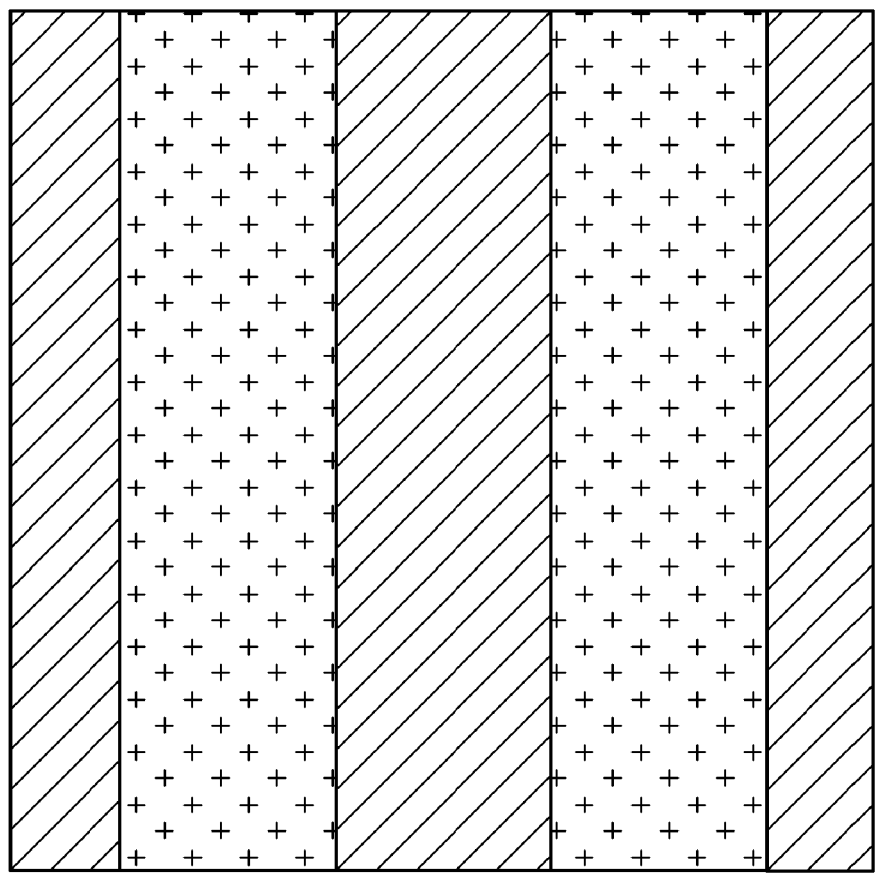

Next, etching is performed to remove a portion of the insulator material 1900 from the trenches 1810, thereby exposing sidewall surfaces 1817 of the semiconductor lines 1815 and resulting in the structure illustrated in the cross-sectional and top views of FIGS. 20A and 20B respectively. The etching can be performed, for example, using a HDP etching process.

Figure 21A:
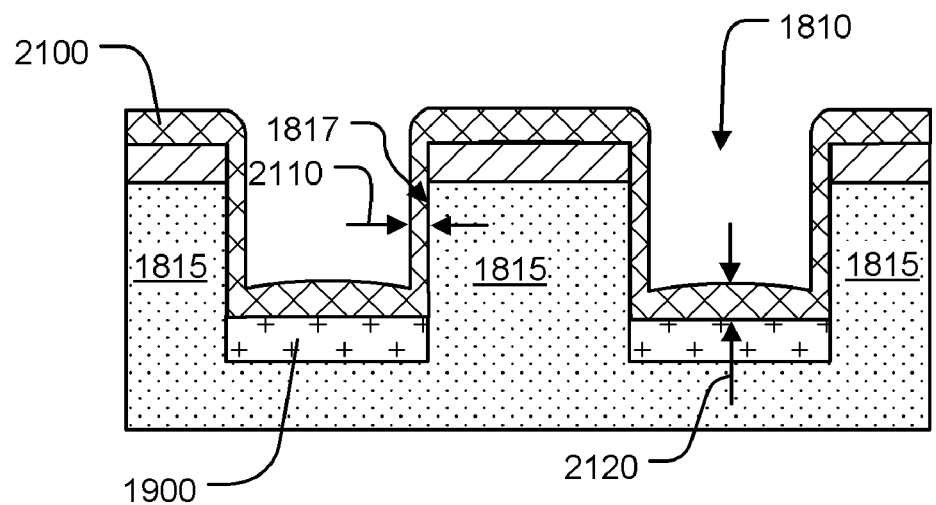
Figure 21B:
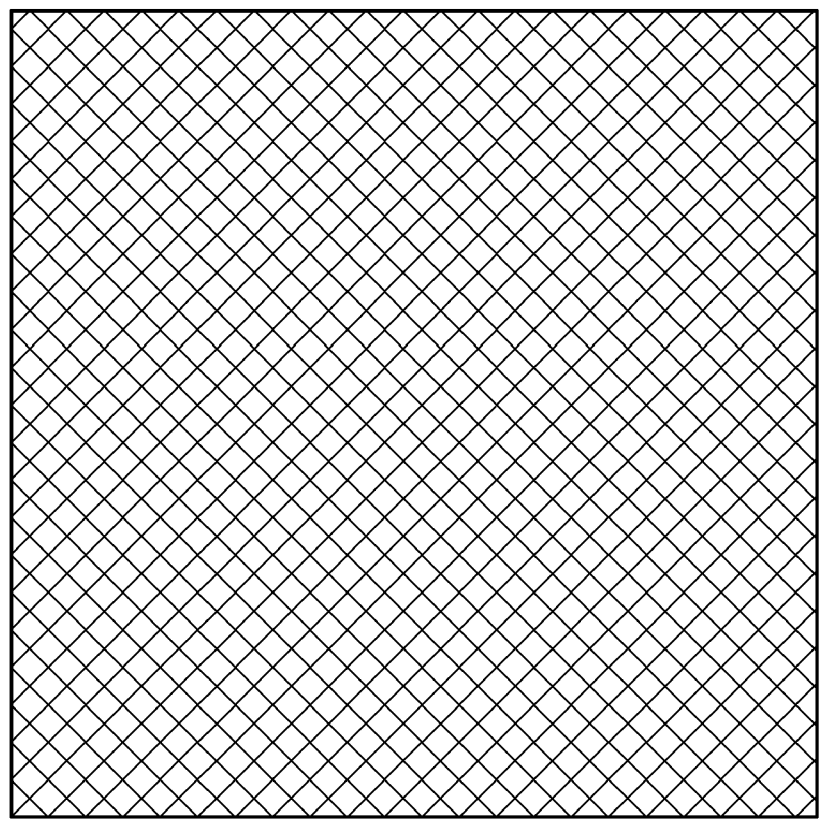

Next, a layer 2100 of silicide precursor is formed on the structure of FIGS. 20A-20B, resulting in the structure illustrated in the top and cross-sectional views of FIGS. 21A and 21B respectively. As can be seen in FIG. 21A, a non-conformal deposition is performed so that the thickness 2110 of the silicide precursor 2100 on the sidewalls 1817 is less than the thickness 2120 of the precursor 2100 on the insulator material 1900 within the trenches 1810. The process may be carried out, for example, using a low pressure sputtering process.

Figure 22A:
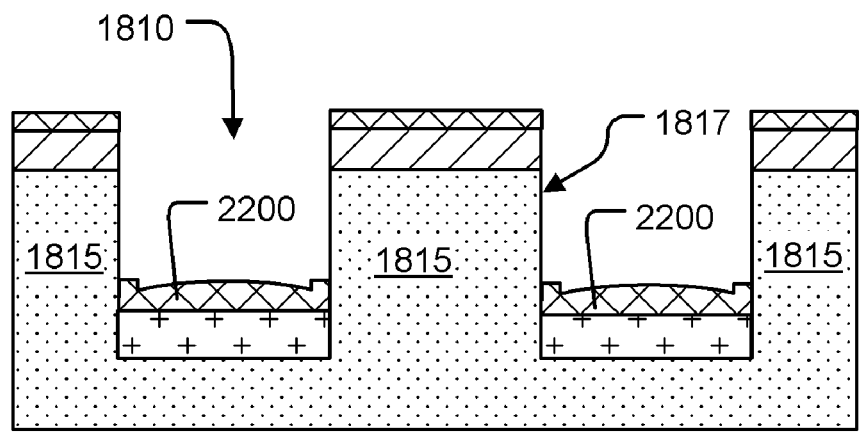
Figure 22B:
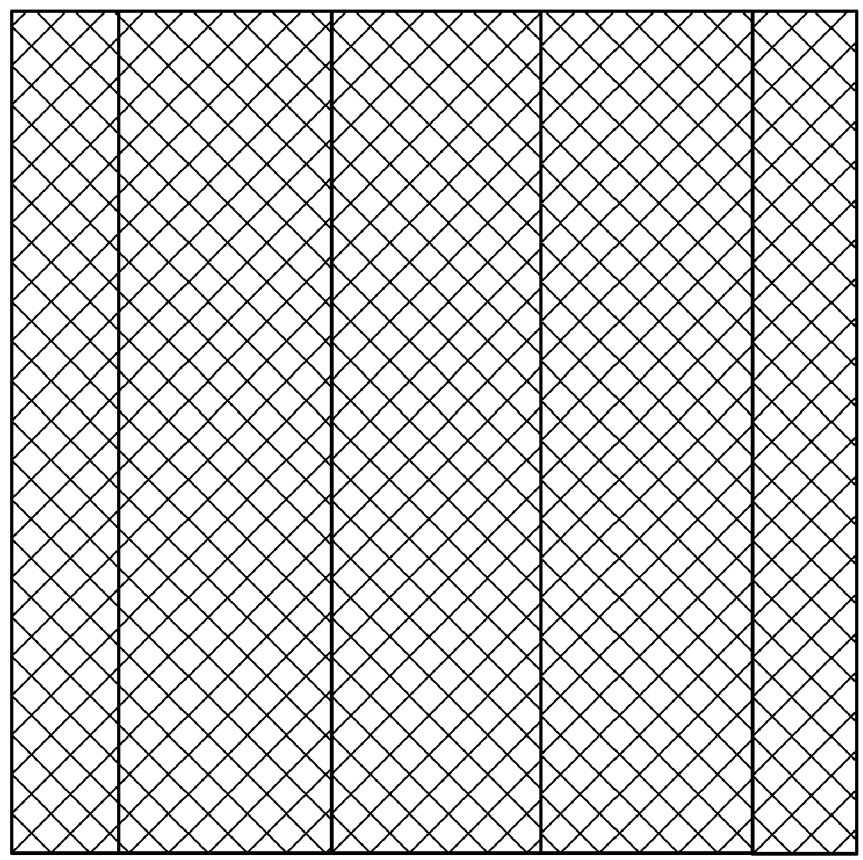

Next, the layer 2100 of silicide precursor is etched using a wet etch process to expose upper portions of the sidewalls 1817 of the semiconductor lines 1815 and leave remaining strips 2200 along the sidewalls 1817 within the trenches 1810, resulting in the structure illustrated in the cross-sectional and top views of FIGS. 22A and 22B respectively.

The wet etch process may be performed, for example, using a dilute HCL etch chemistry.

Figure 23A:
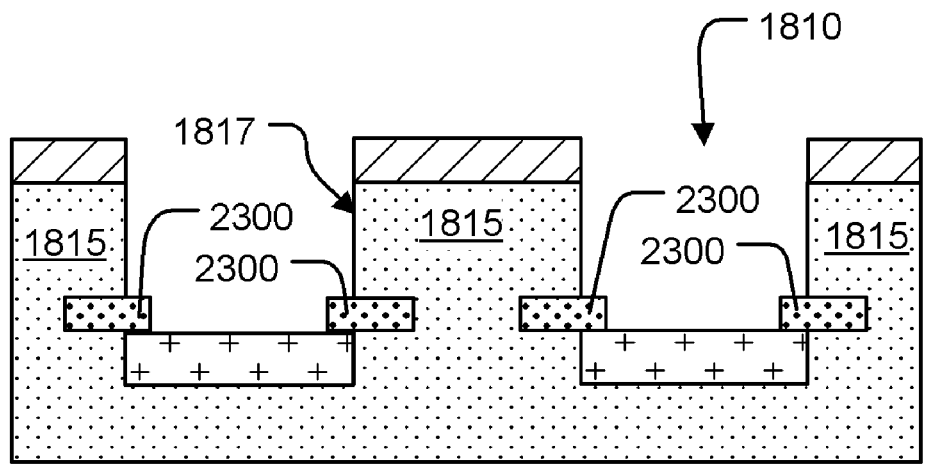
Figure 23B:
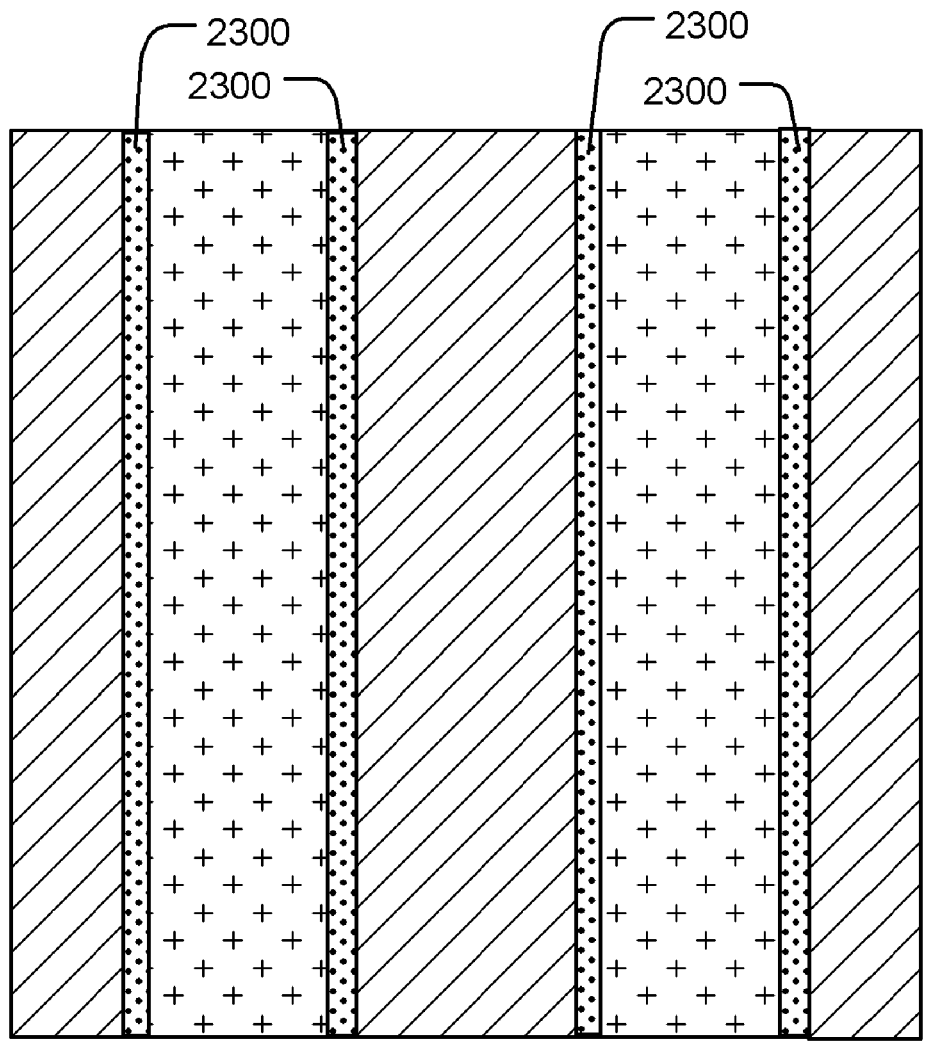

Next, an RTP anneal is performed to induce formation of buried silicide lines 2300 by reaction of the strips 2200 of silicide precursor with the silicon of the semiconductor lines 1815 and the remaining silicide precursor 2100 is removed, resulting in the structure illustrated in the cross-sectional and top views of FIGS. 23A and 23B respectively.

In the illustrated embodiment of FIGS. 23A and 23B, the formation of the buried silicide lines 2300 results in two buried silicide lines 2300 within each of the semiconductor lines 1815, one along each of the sidewalls 1817 and separated by remaining silicon material of the lines 1815.

Figure 24A:
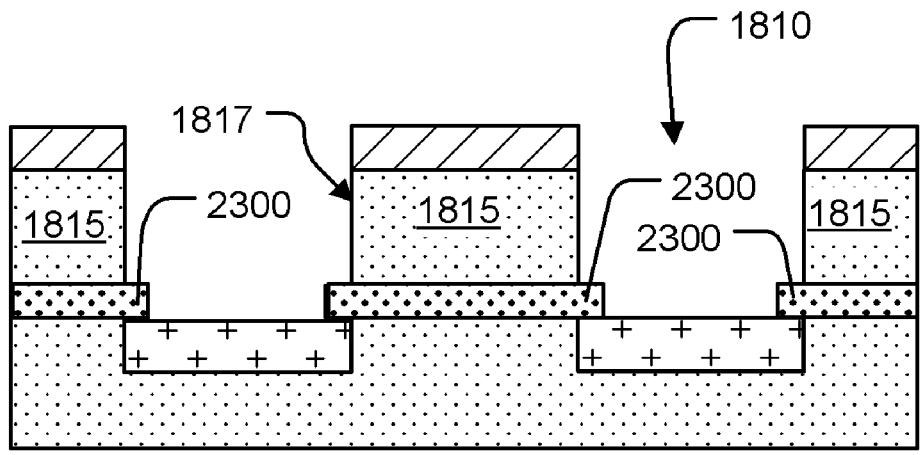
FIGS. 24A-24B illustrate an alternative embodiment to that of FIGS. 23A-23B.
Figure 24B:
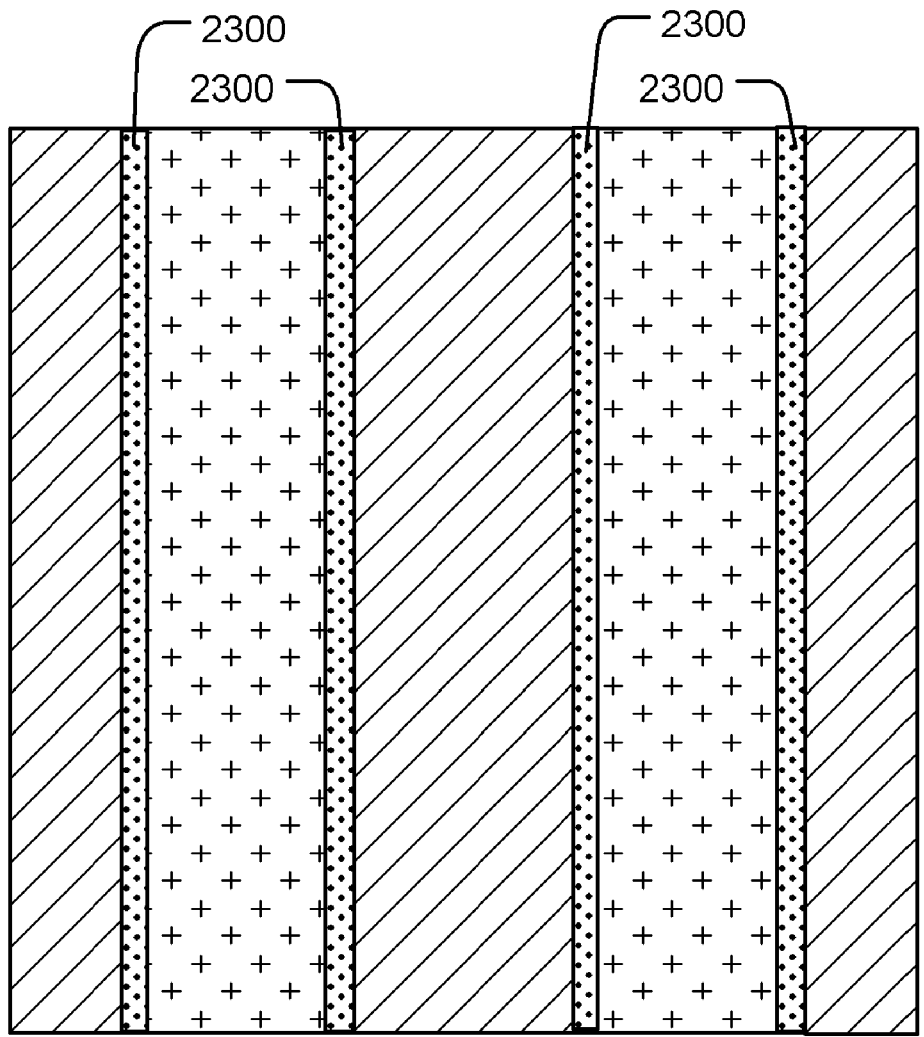

FIGS. 24A and 24B illustrate an alternative embodiment in which the formation of the silicide lines consumes silicon of the semiconductor lines 1815 until the silicide lines 2300 extend between adjacent trenches 1810.

Figure 25:
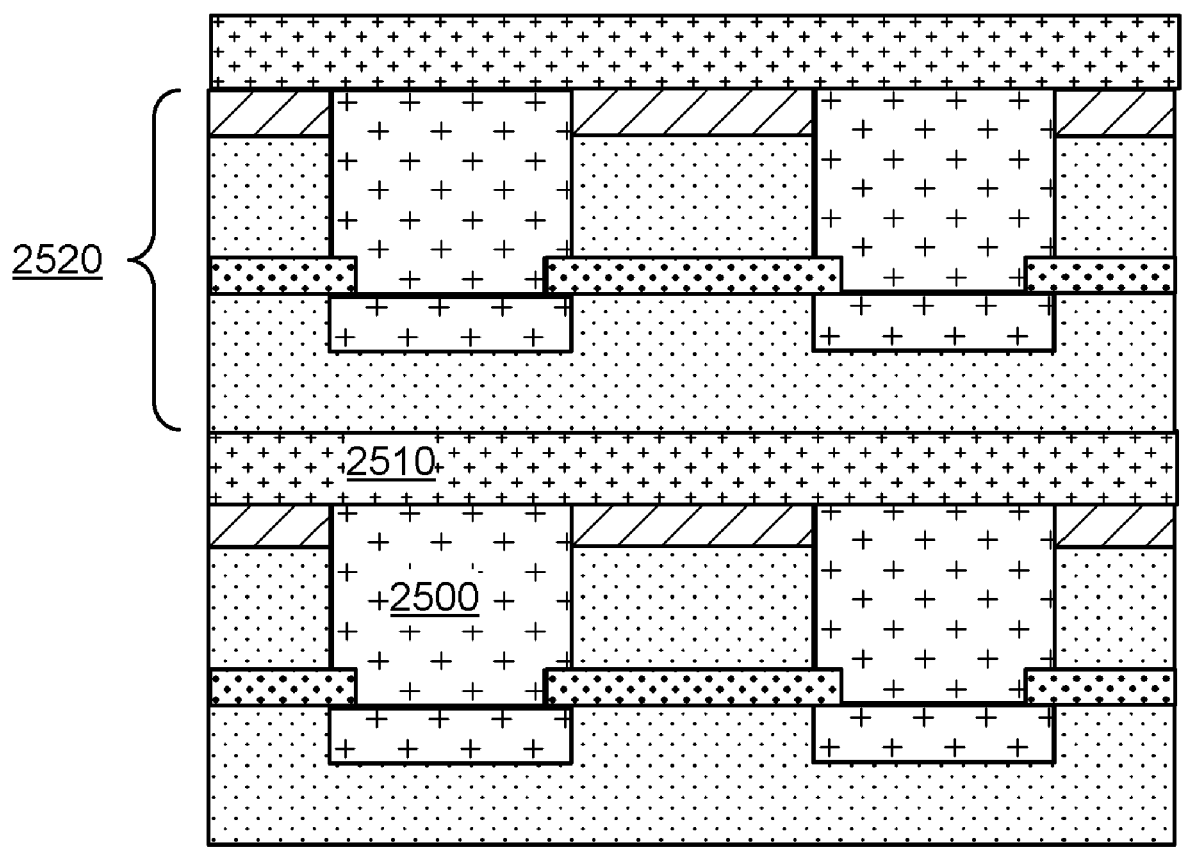
FIG. 25 illustrates a cross-sectional view of applying the steps of FIGS. 18A-18B to 23A-23B to form a stacked structure.

The processes described above for forming the buried silicide lines 2300 can be repeated to form stacked structures of buried silicide lines 2300. For example, an insulator 2500 can be formed within the trenches 1810 of the structure of FIGS. 23A-23B, and an insulator layer 2510 can be formed on the resulting structure. The process described above with reference to FIGS. 18 to 23A-23B can then be repeated to form a second layer structure 2520, resulting in the structure illustrated in the cross-sectional view of FIG. 25.

The method for forming the buried silicide lines 2300 discussed above with respect to FIGS. 18A-18B to 23A-23B can be applied to form a stacked memory cell array having diode access devices, as described below with respect to FIGS. 26 to 28A-28B.

Figure 26:
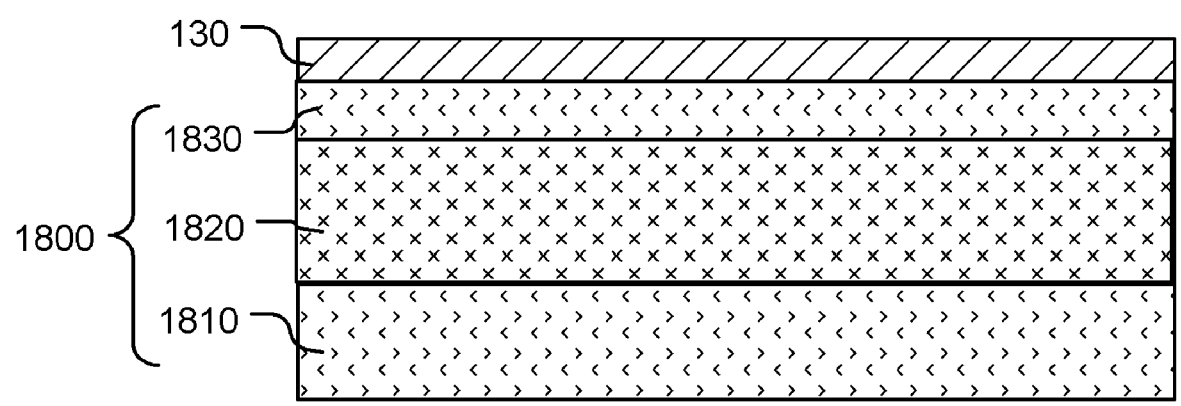

FIG. 26 illustrates a cross-sectional view of forming a semiconductor substrate 1800 having a well 1810 with a first conductivity type, a lower portion 1820 on the well and having a second conductivity type opposite that of the first conductivity type, and an upper portion 1830 on the lower portion 1820 and having the first conductivity type. For example, if the well 1810 and the upper portion 1830 have n-type conductivity, the lower portion 1820 has a p-type conductivity.

Figure 27A:
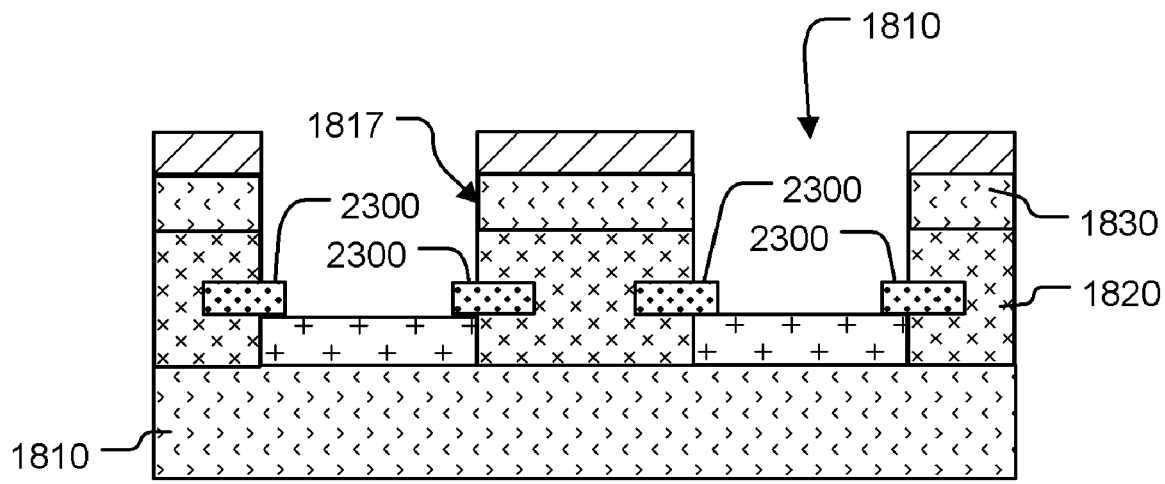
Figure 27B:
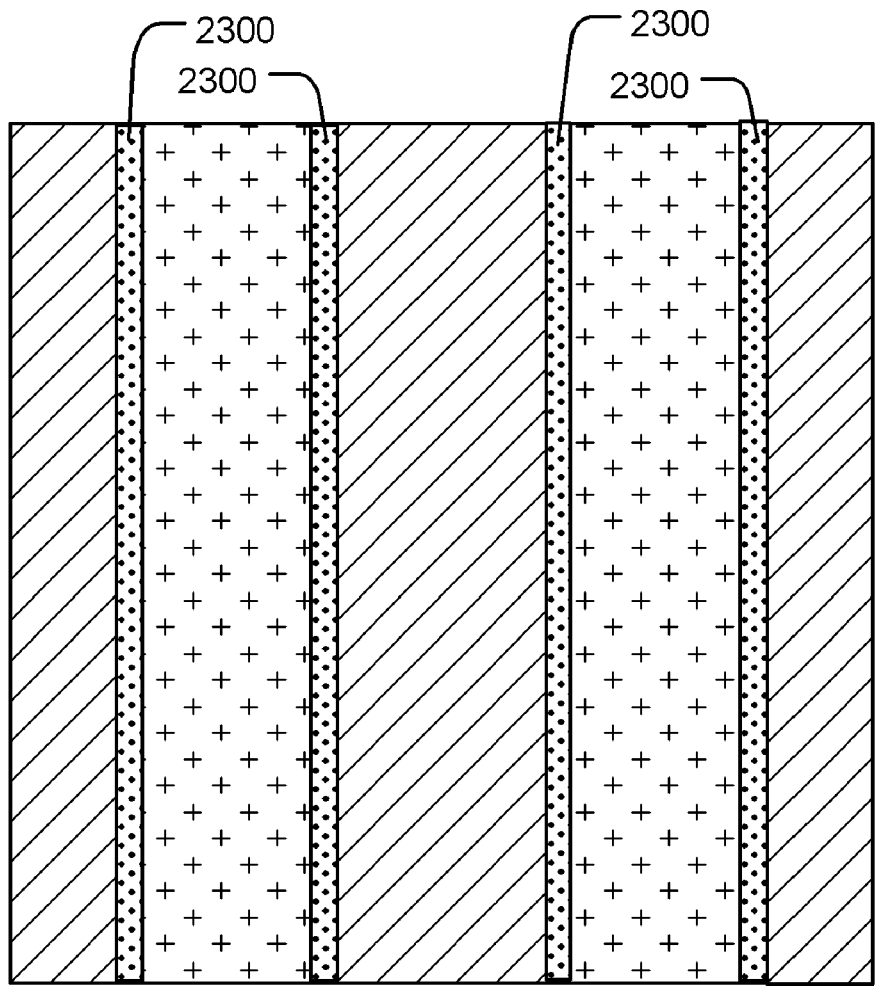

Next, the processes of FIGS. 18A-18B to 23A-23B can be carried out on the structure illustrated in FIG. 26, resulting in the structure having buried silicide lines 2300 as illustrated in the cross-sectional and top views of FIGS. 27A and 27B respectively.

Figure 28A:
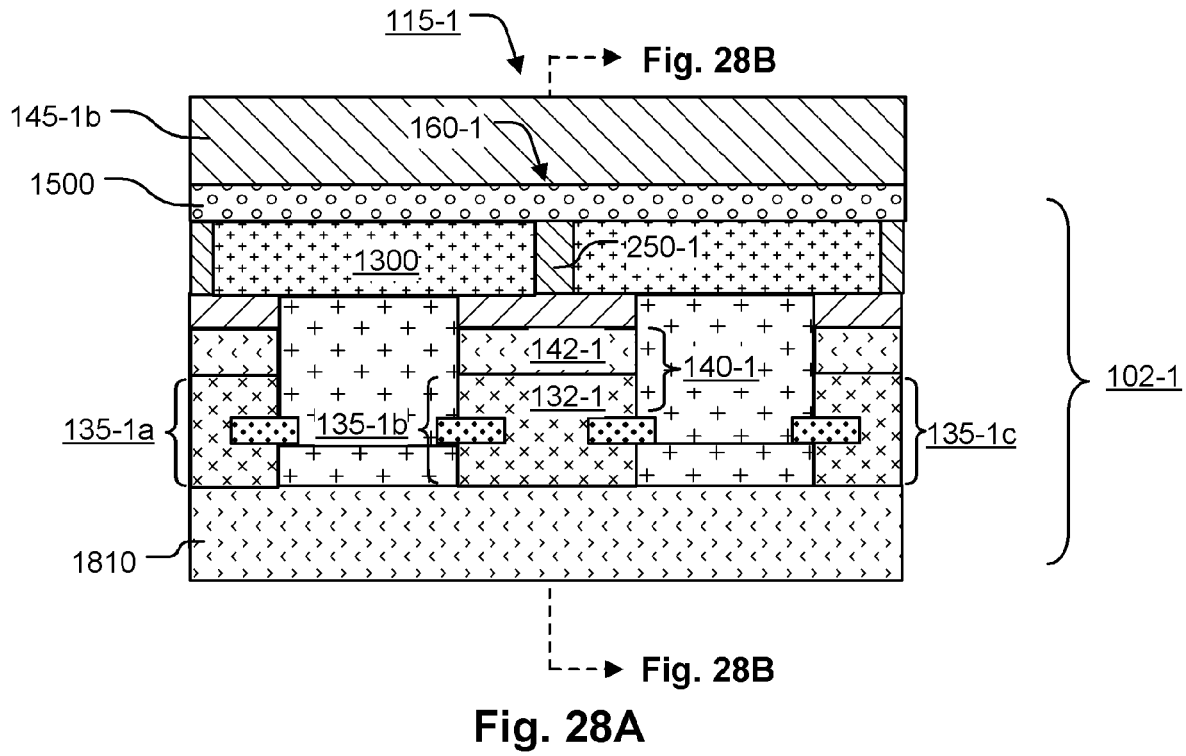
Figure 28B:
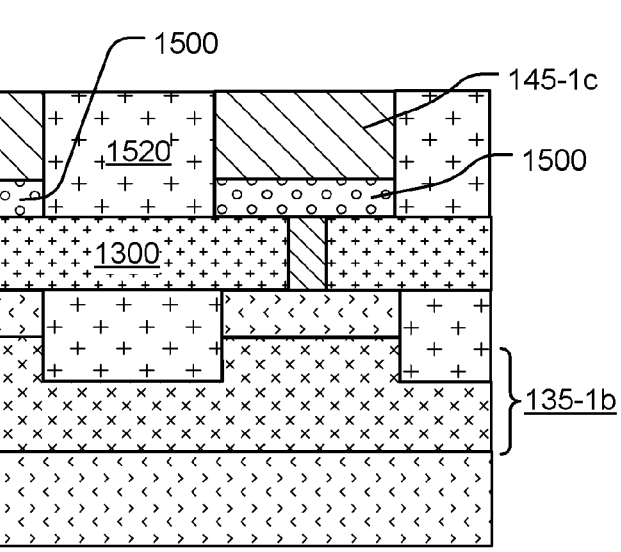

The processes described above with respect to FIGS. 10-10B to 15A-15B can then be carried out on the structure 27A-27B, resulting in the formation of the first array 102-1 having a plurality of memory cells as illustrated in the cross-sectional views of FIGS. 28A and 28B. The process of FIGS. 26 to 28A-28B can then be repeated to form a stacked structure comprising a plurality of the arrays.

Figure 29:
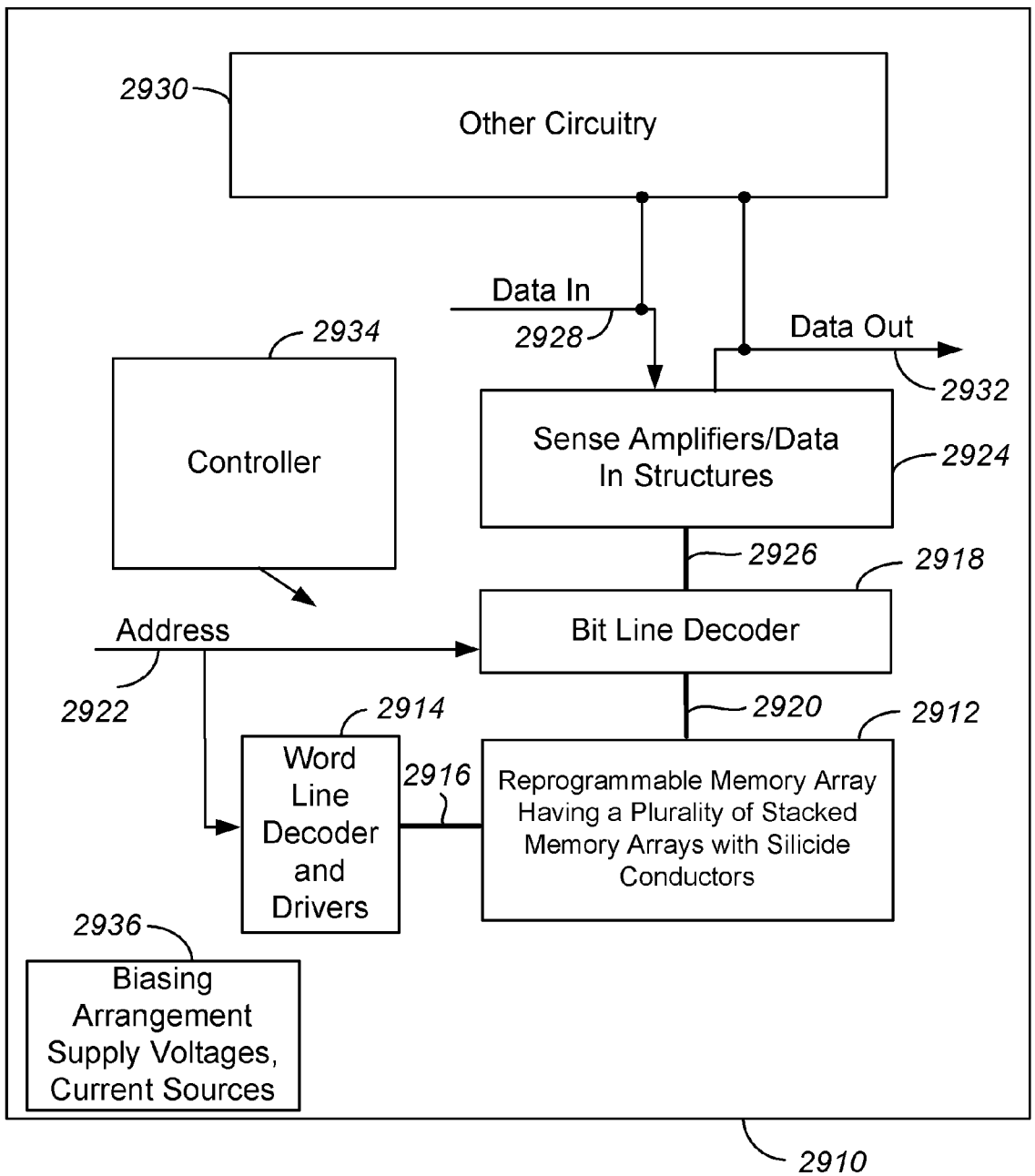
FIG. 29 is a simplified block diagram of an integrated circuit including a memory array implemented using a plurality of arrays of memory cells as described herein.

FIG. 29 is a simplified block diagram of an integrated circuit 2910 including a memory array 3412 implemented using a plurality of arrays as described herein. A word line decoder 2914 having read, set and reset modes is coupled to and in electrical communication with a plurality of word lines 2916 arranged along rows in the memory array 2912. A bit line (column) decoder 2918 is in electrical communication with a plurality of bit lines 2920 arranged along columns in the array 2912 for reading, setting, and resetting the phase change memory cells (not shown) in array 2912. Addresses are supplied on bus 2922 to word line decoder and drivers 2914 and bit line decoder 2918. Sense amplifiers and data-in structures in block 2924, including voltage and/or current sources for the read, set, and reset modes are coupled to bit line decoder 2918 via data bus 2926. Data is supplied via a data-in line 2928 from input/output ports on integrated circuit 2910, or from other data sources internal or external to integrated circuit 2910, to data-in structures in block 2924. Other circuitry 2930 may be included on integrated circuit 2910, such as a general purpose processor or special purpose application circuitry, or a combination of modules providing system-on-a-chip functionality supported by array 2912. Data is supplied via a data-out line 2932 from the sense amplifiers in block 2924 to input/output ports on integrated circuit 2910, or to other data destinations internal or external to integrated circuit 2910.

A controller 2934 implemented in this example, using a bias arrangement state machine, controls the application of bias arrangement supply voltages and current sources 2936, such as read, program, erase, erase verify and program verify voltages and/or currents. Controller 2934 may be implemented using special-purpose logic circuitry as known in the art. In alternative embodiments, controller 2934 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 2934.

Embodiments of the programmable resistive material of the memory elements described herein include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing an integrated circuit device, the method comprising:
   forming a semiconductor body comprising silicon;
   forming a plurality of trenches in the semiconductor body to define semiconductor lines comprising silicon between adjacent trenches, the semiconductor lines having sidewalls;
   depositing a silicide precursor within the trenches to contact the sidewalls of the semiconductor lines;
   removing a portion of the silicide precursor to expose upper portions of the sidewalls and leave remaining strips of silicide precursor along the sidewalls; and
   forming silicide conductors by inducing reaction of the strips of silicide precursor with the silicon of the semiconductor lines, wherein the forming silicide conductors consumes silicon of the semiconductor lines until the silicide conductors extend between adjacent trenches in the plurality of trenches.

2. The method of claim 1, wherein the forming silicide conductors comprises annealing to form the silicide conductors.

3. The method of claim 1, wherein:
   forming the semiconductor body comprises forming an insulator layer, forming a silicon layer on the insulator layer, and forming a protection layer on the silicon layer;
   forming the plurality of trenches comprises etching through the protection layer and the silicon layer to expose underlying portions of the insulator; and
   depositing a silicide precursor includes depositing the silicide precursor on the protection layer and the exposed portions of the insulator.

4. The method of claim 3, wherein:
   forming the silicon layer comprises forming a lower portion of the silicon layer having a first conductivity type, and forming an upper portion of the silicon layer on the lower portion and having a second conductivity type different from the first conductivity type;
   removing a portion of the silicide precursor leaves the remaining strips of silicide precursor below a top surface of the lower portion of the silicon; and
   the forming silicide conductors forms the silicide conductors within the lower portion of the silicon layer.

5. The method of claim 4, wherein forming the upper and lower portions of the silicon layer comprises implanting dopants within the silicon layer.

6. The method of claim 4, further comprising:
   filling the trenches with an insulator material, and removing the protection layer to expose top surfaces of the upper portion of the silicon layer; and
   forming a plurality of second trenches extending below the top surfaces of the lower portion of the silicon layer to define a plurality of diodes along the semiconductor lines, the diodes having a first node comprising remaining material of the upper portion of the silicon, and having a second node comprising material of the lower portion of the silicon layer underlying the first node.

7. The method of claim 6, further comprising:
forming a plurality of memory elements coupled to respective diodes in the plurality to diodes; and
forming a plurality of access lines overlying and coupled to memory elements in the plurality of memory elements.

8. The method of claim 7, further comprising:
forming a second insulator layer overlying the plurality of access lines;
forming a second silicon layer on the second insulator layer;
forming a plurality of third trenches in the second silicon layer to define second semiconductor lines comprising silicon between adjacent third trenches, the second semiconductor lines having sidewalls;
depositing a second silicide precursor within the third trenches to contact the sidewalls of the second semiconductor lines;
removing a portion of the silicide precursor to expose upper portions of the sidewalls of the second semiconductor lines and leave remaining strips of second silicide precursor; and
forming the second silicide conductors by inducing reaction of the strips of the second silicide precursor with the silicon of the second semiconductor lines.

9. The method of claim 1, wherein:
forming the semiconductor body comprises forming a silicon substrate, and forming a protection layer on the silicon substrate; and
forming the plurality of trenches comprises:
    forming the plurality of trenches through the protection layer and into the silicon substrate;
    depositing an insulator material on a bottom portion of the plurality of trenches to cover the silicon substrate underlying the plurality of trenches, wherein a portion of the sidewalls of the semiconductor lines are exposed;
    depositing a silicide precursor includes depositing the silicide precursor on the exposed sidewalls and on the insulator material.

10. The method of claim 9, wherein the silicon substrate comprises single crystalline silicon.

11. The method of claim 9, wherein the depositing an insulator material comprises:
filling the plurality of trenches with the insulator material; and
removing a portion of the insulator material from the plurality of trenches to expose the portions of the sidewalls of the semiconductor lines.

12. The method of claim 9, wherein:
forming the silicon substrate comprises forming a lower portion of the silicon substrate having a first conductivity type, and forming an upper portion of the silicon substrate having a second conductivity type different from the first conductivity type;
removing a portion of the silicide precursor leaves the remaining strips of silicide precursor below a top surface of the lower portion of the silicon substrate; and
the forming the silicide conductors forms the silicide conductors within the lower portion of the silicon substrate.

13. The method of claim 12, further comprising:
filling the trenches with a second insulator material, and removing the protection layer to expose top surfaces of the upper portion of the silicon substrate; and
forming a plurality of second trenches extending below the top surfaces of the lower portion of the silicon substrate to define a plurality of diodes along the semiconductor lines, the diodes having a first node comprising remaining material of the upper portion of the silicon substrate, and having a second node comprising material of the lower portion of the silicon substrate underlying the first node.

* * * * *

UNITED STATES PATENT AND TRADEMARK OFFICE
CERTIFICATE OF CORRECTION

PATENT NO. : 8,168,538 B2
APPLICATION NO. : 12/472158
DATED : May 1, 2012
INVENTOR(S) : Shih-Hung Chen et al.

It is certified that error appears in the above-identified patent and that said Letters Patent is hereby corrected as shown below:

In claim 6, column 14, line 67, after the word "silicon" insert the word -- layer --.

In claim 7, column 15, line 5, delete the word "to" and insert the word -- of --.

Signed and Sealed this
Tenth Day of July, 2012

David J. Kappos
*Director of the United States Patent and Trademark Office*